United States Patent [19]
Yuen et al.

[11] Patent Number: 5,835,514
[45] Date of Patent: Nov. 10, 1998

[54] LASER-BASED CONTROLLED-INTENSITY LIGHT SOURCE USING REFLECTION FROM A CONVEX SURFACE AND METHOD OF MAKING SAME

[75] Inventors: Albert T. Yuen, Cupertino; Tao Zhang, Mountain View; David M. Sears, Los Gatos; Leif Eric Larson, San Jose, all of Calif.

[73] Assignee: Hewlett-Packard Company, Palo Alto, Calif.

[21] Appl. No.: 591,846

[22] Filed: Jan. 25, 1996

[51] Int. Cl.$^6$ .............................. H01S 3/04; H01S 3/18; G02B 6/36; H01L 33/00

[52] U.S. Cl. .............................. 372/36; 372/43; 372/28; 257/98; 257/81; 385/93; 385/33; 385/35

[58] Field of Search .............................. 372/29, 31, 33, 372/43, 44, 45, 46, 50, 92, 96, 109, 36; 385/33, 35, 93; 257/81, 82, 83, 98

[56] References Cited

U.S. PATENT DOCUMENTS

| | | | |
|---|---|---|---|
| 5,247,167 | 9/1993 | Bargerhuff et al. | 250/208.1 |
| 5,542,018 | 7/1996 | Kuhara et al. | 372/50 |
| 5,555,334 | 9/1996 | Ohnishi et al. | 385/93 |

FOREIGN PATENT DOCUMENTS

| | | | |
|---|---|---|---|
| 60-158682 | 8/1985 | Japan | 372/43 |
| 01260882 | 10/1989 | Japan | H01S 3/18 |
| 1-286379 | 11/1989 | Japan | 372/43 |
| 02165684 | 6/1990 | Japan | H01S 3/18 |
| 04199890 | 7/1992 | Japan | H01S 3/18 |
| 06209138 | 7/1994 | Japan | H01S 3/18 |

*Primary Examiner*—Rodney B. Bovernick
*Assistant Examiner*—Luong-Quyen T. Phan
*Attorney, Agent, or Firm*—Ian Hardcastle

[57] ABSTRACT

An integrated laser-based light source that generates an output light beam having a controlled intensity. The light source comprises a light sensor, a laser, a convex beam-splitting surface, and a package that includes a header. The light sensor generates an electrical signal representing an intensity of light energy falling on it, and is mounted on the header. The laser has one and only one light-emitting face from which a light beam is radiated as a radiated light beam. The laser is mounted in the package adjacent the light sensor with the light-emitting face substantially parallel to the light-receiving face of the light sensor. The convex beam-splitting surface reflects a fraction of the radiated light beam towards the light sensor as a reflected light beam, and transmits the remainder of the radiated light beam as the output light beam. The convex beam-splitting surface is supported in the radiated light beam by the package.

22 Claims, 12 Drawing Sheets

5,835,514

LASER-BASED CONTROLLED-INTENSITY LIGHT SOURCE USING REFLECTION FROM A CONVEX SURFACE AND METHOD OF MAKING SAME

FIELD OF THE INVENTION

This invention relates to laser-based light sources and, in particular to laser-based light sources generating light having a controlled intensity.

BACKGROUND OF THE INVENTION

Lasers are used as light sources in many consumer and industrial products including laser printers and optical communication links. In laser printers, the light output of the laser is modulated to selectively discharge the photo conductive drum. In optical communication links, the light output of the laser is modulated to represent the states of a digital information signal. Lasers having a modulated light output are also used to write a digital information signal on an optical disc, for example. In these and other applications, the need to modulate the light output of the laser at high speed normally precludes modulating the light output by simply switching the laser on and off. Instead, the light output of the laser is modulated between a high light condition and a low light condition, which is normally just above threshold level of the laser. However, in the following disclosure, the low-light condition will be regarded as encompassing the zero-light condition in which the laser current is reduced to below the threshold current or to zero.

When the light output of the laser is modulated between a high light condition and a low light condition, the light intensity in at least one of the two light conditions must be well defined. For example, in the laser printer application, when the low light condition is above the zero light condition, the light intensity in the low light condition must remain below the discharge threshold of the photo conductive drum. Moreover, since the size of the spot on the photo conductive drum discharged by the light beam depends on the intensity of the light beam, the intensity of the laser in the high light condition must also be defined to ensure consistent line widths. In the optical communication link application, the difference between the high light condition and the low light condition may be made relatively small to maximize the modulation rate, and hence the data transmission speed. The light intensities in both light conditions must be accurately defined to enable the two light conditions to be distinguished from one another by the receiver of the optical communication link.

The light intensity generated by a semiconductor laser for a given laser current depends primarily on the temperature of the laser. Aging is a secondary factor. The temperature of the laser depends in part on the magnitude and the duty cycle of the current through the laser, i.e., the laser current. The duty cycle of the laser depends on the digital input signal modulating the laser. For example, in a laser printer, the laser continuously generates light in the high light condition to create "area fills," and continuously generates light in the low light condition to create white areas, such as margins and borders. The thermal time constant of a typical semiconductor laser is very rapid, of the same order as the time required to print about ten pixels. Thus, if the light output of the laser increases with increasing temperature, for example, the temperature, and hence the light output, of the laser will steadily increase (with a resulting increase in print density and line width) in the course of printing an area fill. On the other hand, isolated narrow vertical lines printed in a white area will tend to be printed too faintly because of insufficient light output from the laser as a result of the laser temperature being too low.

To prevent variations in the light intensity generated by the laser from impairing the performance of the laser printer, optical communication link or other laser-based apparatus, it is desirable to employ a control system to vary the laser current to maintain the light intensity at a predetermined level in the high light condition or in the low light condition, or to maintain the light intensity at a first predetermined level in the high light condition and at a second predetermined level in the low light condition, irrespective of the temperature and the age of the laser.

FIG. 1 shows part of a known laser light source 10 generating light with a controlled intensity. In the laser light source 10, the edge-emitting laser 12 is mounted on the post 14 projecting from the header 16. The can 17 is attached to the header 16, and usually forms a hermetic seal with the header. The can includes the window 19 though which the light beam 18 generated by the laser 12 is emitted. The window is normally coated with the anti-reflective layer 21 to prevent the window from reflecting part of the light beam 18 back into the laser 12.

The edge-emitting laser 12 is formed by creating a structure in a suitable semiconductor such as gallium arsenide. The edge-emitting laser 12 emits the light beam 18 in response to a current supplied from an external power source via the conductor 30, which passes through an electrically-isolated passage (not shown) in the header 16, and the bonding wire 31, which connects the conductor 30 to a metallization layer (not shown) on the laser 12. The edge-emitting laser 12 emits the light beam 18 from a very narrow aperture about 0.1 μm wide in the cleaved edge 20, and also emits the secondary light beam 24 from the cleaved edge 26, opposite the cleaved edge 20.

In applications in which the intensity of the light generated by the edge-emitting laser 12 must be controlled, the light sensor 28 is mounted on the header 16 positioned to be directly illuminated by the secondary light beam 24. The light sensor 28 is typically a silicon, gallium arsenide, or indium gallium arsenide photo diode, the type depending on the wavelength of the light generated by the laser 12. The electrical output of the light sensor 28 is fed to the outside of the package by the conductor 32, which passes through an electrically-isolated passage (not shown) in the header, and the bonding wire 33, which connects the conductor 32 to a metallization layer (not shown) on the light sensor 28.

The conductor 32 is also connected to the control circuit 34. The control circuit also receives a digital input signal via the input terminal 36. The state of the digital input signal determines whether the control circuit drives the laser 12 to emit the light beam in the high light condition or in the low light condition. The control circuit 34 controls the current fed to the laser 12 via the conductors 30 and 31 to obtain a predetermined value of the electrical output of the light sensor 28 in one or both of the high light condition and the low light condition. This predetermined value of the output of the light sensor 28 corresponds to the secondary light beam 24 having a predetermined intensity in the respective light condition. Since the intensity of the secondary light beam 24 has a substantially linear relationship to that of the primary light beam 18, the light sensor 28 monitoring the intensity of the secondary light beam 24 conveniently provides an acceptably accurate control of the intensity of the primary light beam 18.

Recently, vertical-cavity surface-emitting lasers (VCSELs) have been introduced. Such lasers are formed in a structure of semiconductor layers deposited on a semiconductor substrate, and emit light from a port in the surface of the structure, instead of from the very narrow region about 0.1 µm wide on the cleaved edge of the device, as in an edge-emitting laser. A VCSEL offers numerous performance advantages over an edge-emitting laser. For example, a VCSEL inherently has a smaller numeric aperture and generates a much more symmetrical light beam than an edge-emitting laser. As a result, the light from the VCSEL can be coupled into the optical system of the laser printer or optical communication link more efficiently than the light from the edge-emitting laser. The increased coupling efficiency enables the VCSEL to be run at lower power to produce a given light intensity. However, the VCSEL generally emits a single light beam instead of the two light beams emitted by the edge-emitting laser. Therefore, a VCSEL-based light source generating light with a controlled intensity cannot be made simply by substituting the VCSEL for the edge-emitting laser 12 in the arrangement shown in FIG. 1. An alternative arrangement is required to monitor the intensity of the light generated by the VCSEL.

A possible solution for this problem is described in G. Hasnian et al., *Monolithic Integration of Photodiode with Vertical Cavity Surface Emitting Laser,* 27 ELECTRONICs LETTERS 18, p. 1630 (1991). In this, a p-i-n photo diode is grown on the p-type mirror region of a top-emitting VCSEL. Although this arrangement gives a good monitoring performance, it increases the complexity of the manufacturing process because additional epitaxial layers must be deposited to provide the layers of the photo diode, and because an additional etching process is required to delineate the photo diode. Moreover, the etching process leaves the edges of the layers exposed to contamination which can compromise the reliability and accuracy of the arrangement.

U.S. Pat. No. 5,491,712, assigned to the Assignee of the present application, describes some alternative arrangements for monitoring the intensity of the light generated by a VCSEL. In a first one of these, a Schottky structure is formed as a photo detector on the top surface of the layer structure in which the VCSEL is formed. This arrangement also requires that additional layers be deposited on the layer structure of the VCSEL, albeit fewer than the number of additional layers required for the p-i-n photo diode.

In a second arrangement, a photo detector is delineated adjacent the VCSEL in the layer structure in which the VCSEL is formed. Light is transmitted laterally in the layer structure between the light-generating layer of the VCSEL and the photo detector. The magnitude of the current flowing through the photo detector in response to a reverse bias applied to the photo detector (as opposed to the forward bias to which the VCSEL is subject) represents the intensity of the light in the light generating layer of the VCSEL. This arrangement provides a structurally-simple way to monitor the intensity of the light in the light-generating layer of the VCSEL, but may not provide an acceptable intensity monitoring accuracy because the relationship between the intensity of the light in the light-generating layer and the intensity of the light beam actually emitted by the VCSEL is not well defined.

SUMMARY OF THE INVENTION

The invention provides an integrated laser-based light source that generates an output light beam having a controlled intensity. The light source comprises a light sensor, a laser, a convex beam-splitting surface, and a package that includes a header. The light sensor generates an electrical signal representing the intensity of light energy falling on it, and is mounted on the header. The laser has one and only one light-emitting face from which a light beam is radiated as a radiated light beam. The laser is mounted in the package adjacent the light sensor with the light-emitting face substantially parallel to the light-receiving face of the light sensor. The convex beam-splitting surface reflects a fraction of the radiated light beam towards the light sensor as a reflected light beam, and transmits the remainder of the radiated light beam as the output light beam. The convex beam-splitting surface is supported in the radiated light beam by the package.

The convex beam-splitting surface reflects the fraction of the radiated light beam towards the light sensor while minimizing the intensity of light returning to the laser following reflection by the light sensor and a second reflection by the convex beam-splitting surface. The reflected light beam diverges from the convex beam-splitting surface, which reduces the accuracy with which the light sensor must be located relative to the laser to receive the reflected light beam.

The convex beam-splitting surface may include a reflection control element that determines the intensity ratio between the reflected light beam and the output light beam.

The laser and the light sensor may be mounted side-by-side on the header. Alternatively, the laser may be mounted on part of the light-receiving face of the light sensor.

The package may include a can attached to the header, and the can may support the convex beam-splitting surface in the radiated light beam.

The light source may additionally comprise a lens that includes the convex beam-splitting surface.

The package may include an axial bore in which the lens is mounted, and a body portion optically aligned with the axial bore. In this embodiment, the body portion is dimensioned to accommodate the header in an adjustable position relative to the lens, and the axial bore includes a portion dimensioned to receive an optical fibre and to position the optical fibre accurately in a predetermined position relative to the lens.

The laser, the light sensor and the convex beam-splitting surface may be arranged such that light reflected by the light-receiving face of the light sensor is directed away from the light-emitting face of the laser to reduce noise in the output light beam.

The light source may additionally include a controller that controls the laser current in response to the electrical signal generated by the light sensor. The controller may additionally control the laser current to limit the electrical signal generated by the light sensor to a predetermined maximum corresponding to a predetermined maximum intensity of the output light beam.

The radiated light beam generated by the laser may have a signal-to-noise ratio that depends on its intensity. The intensity at which the radiated light beam has a signal-to-noise ratio above a threshold level may be greater than a predetermined maximum intensity. In this case, the beam-splitting surface may reflect such a fraction of the radiated light beam to the light sensor that the output light beam has a signal-to-noise ratio greater than the threshold level and an intensity less than the predetermined maximum intensity.

The invention also provides an integrated laser-based light source for illuminating an optical fibre with an output light beam having a controlled intensity. The light source comprises a laser/sensor assembly, a ball lens, and a package. The laser/sensor assembly includes a header, a light sensor, and a laser. The light sensor generates an electrical signal representing the intensity of light energy falling on it, and is mounted on the header. The laser has one and only one light-emitting face from which a light beam is radiated as a radiated light beam. The laser is mounted adjacent the light sensor with the light-emitting face substantially parallel to the light-receiving face. The package includes an axial bore and a body portion. The ball lens is mounted in the axial bore, which includes a portion dimensioned to receive the optical fibre and to position the optical fibre accurately relative to the ball lens. The body portion is optically aligned with the axial bore and is dimensioned to adjustably accommodate the laser/sensor assembly in a position, relative to the ball lens, at which the ball lens reflects a fraction of the radiated light beam towards the light sensor as a reflected light beam, at which the ball lens transmits a remainder of the radiated light beam as the output light beam, and at which the intensity of the output light beam is maximized.

The laser and the light sensor may be mounted side-by-side on the header. Alternatively, the laser may be mounted on part of the light-receiving face of the light sensor.

Finally, the invention provides a method of making an integrated laser-based light source for illuminating an optical fibre with an output light beam having a controlled intensity. In the method, a laser/sensor assembly, a lens having a convex surface, and a package are provided. The laser/sensor assembly includes a header, a light sensor, and a laser. The light sensor generates an electrical signal representing the intensity of light energy falling on it, and is mounted on the header. The laser has one and only one light-emitting face from which a light beam is radiated as a radiated light beam, and is mounted adjacent the light sensor with the light-emitting face substantially parallel to the light-receiving face. The package includes an axial bore including portions dimensioned to receive the lens and the optical fibre such that the optical fibre is positioned accurately in a predetermined position relative to the lens. The package also includes a body portion optically aligned with the axial bore and dimensioned to receive the laser/sensor assembly with a clearance fit.

The lens is mounted in the axial bore of the package. The laser/sensor assembly is inserted into the body portion to a position at which the convex surface of the lens reflects a fraction of the radiated light beam towards the light sensor as a reflected light beam, and the lens transmits a remainder of the radiated light beam as the output light beam. The position of the laser/sensor assembly relative to the lens is adjusted to maximize the intensity of the output light beam. Finally, the laser/sensor assembly is fixed in the body portion at the position at which the intensity of the output light beam is a maximum.

A curable adhesive may be applied to at least one of the body portion and the laser/sensor assembly, and the adhesive may be cured to fix the laser/sensor assembly in the body portion.

DETAILED DESCRIPTION OF THE INVENTION

An integrated laser-based light source according to the invention has a laser and a light sensor mounted in a common package. The laser generates a radiated light beam in response to a laser current. A coupler is also mounted in the package in a position such that it is illuminated by the radiated light beam. The coupler couples a fraction of the radiated light beam into the light sensor and also provides the remainder of the radiated light beam as the output light beam. The light sensor generates an electrical signal that represents the intensity of the fraction of the radiated light beam coupled to the light sensor by the coupler. Since the light coupled to the light sensor by the coupler is a fraction of the radiated light beam, the electrical signal generated by the light sensor also represents the intensities of the radiated light beam and of the output light beam. A suitable control circuit, when fed with the electrical signal generated by the light sensor, can control the laser current to hold the electrical signal generated by the light sensor to a predetermined value that corresponds to the output light beam having a predetermined intensity.

In the various embodiments that will be described below, examples of couplers operating by partial reflection, back-scattering, back-diffraction, and transmission at one or more surfaces are described. Also described are arrangements in which the laser and the light sensor are mounted on a common surface, on two orthogonal surfaces, coaxially with one on top of the other, or in other arrangements relative to one another. In other examples, the laser and the light sensor are formed in a common layer structure.

References is this disclosure to "light" will be taken to encompass other forms of electromagnetic energy capable of being generated by lasers.

Figure 1:
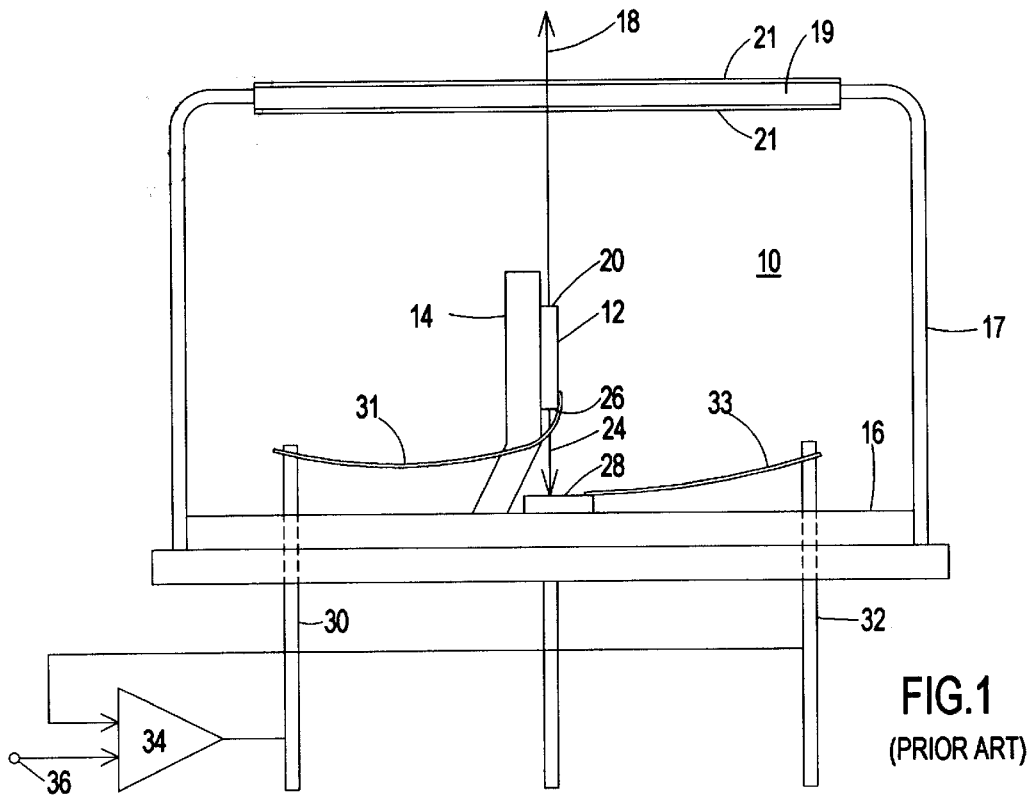
FIG. 1 shows a side view of a known integrated light source generating light with a controlled intensity based on an edge-emitting laser.

A first embodiment 100 of a laser-based light source that generates light with a controlled intensity will now be described with reference to FIG. 2A. In this first embodiment, which uses a slightly modified version of the package used for the edge-emitting laser described above with respect to FIG. 1, the vertical-cavity surface-emitting laser (VCSEL) 101 is mounted on the header 103 of the package 105. The VCSEL 101 emits the radiated light beam 107 from the light-emitting surface 109. The light sensor 111 is mounted on the post 113, which is mounted on the header 103 adjacent the VCSEL 101. The coupler 114 is mounted in the package 105 and couples a fraction of the radiated light beam 107 generated by the VCSEL into the light sensor 111 as the reflected light beam 117, and transmits the remainder of the radiated light beam 107 as the output light beam 119.

The package 105 is completed by the can 106, which is attached to the header 103. The can is normally welded to the header 103 to form a hermetic seal. The can includes the window 108 through which the output light beam 119 exits the light source. The window is normally coated with the anti-reflective layers 110 to prevent the window from reflecting part of the output light beam 119 back into the VCSEL 101.

In this first embodiment, the plane beam splitter 115 operates as the coupler 114 and couples a fraction of the radiated light beam 107 into the light sensor 111 as the reflected light beam 117 and transmits the remainder of the light beam 107 as the output light beam 119. The light sensor 111 generates an electrical signal representing the intensity of the reflected light beam 117 divided from the radiated light beam 107 by the plane beam splitter 115. Since the plane beam splitter reflects a fixed fraction of the light beam 107 as the reflected light beam 117, which it directs into the light sensor 111, and transmits the remainder of the radiated light beam 107 as the output light beam 119, the electrical signal generated by the light sensor 111 also represents the intensity of the output light beam 119 radiated by the light source 100, and is therefore suitable for controlling the intensity of the output light beam 119 generated by the VCSEL-based light source 100.

Figure 2A:
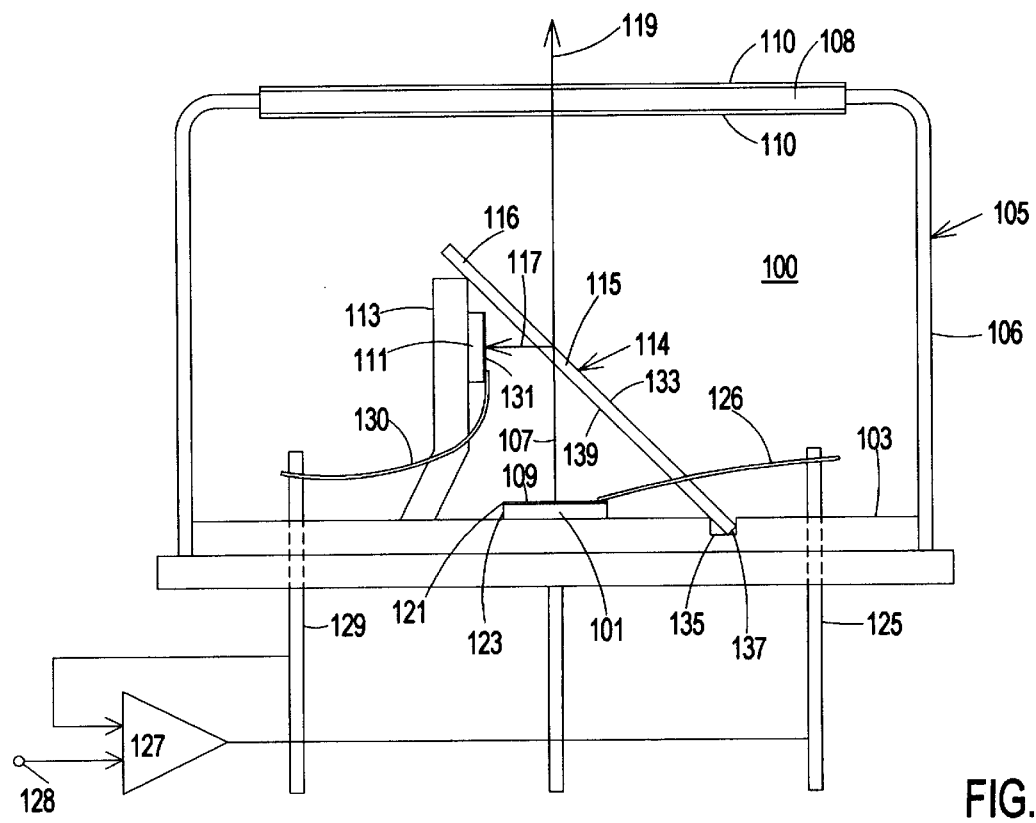
FIG. 2A shows a side view of a first embodiment of an integrated laser-based light source according to the invention for generating light with a controlled intensity.
Figure 2B:
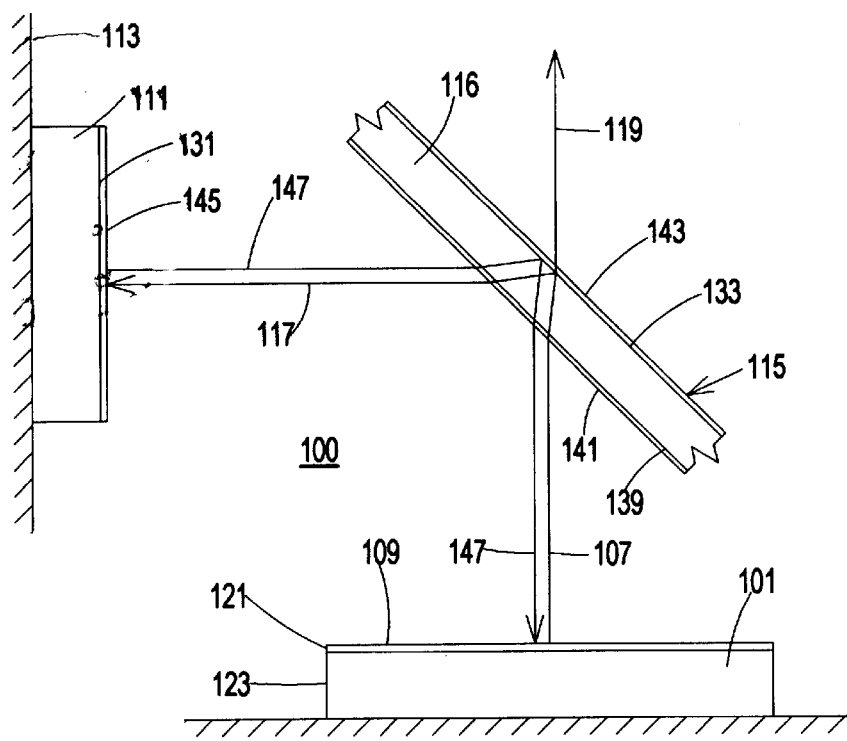
FIG. 2B shows more details of the optical arrangement of the embodiment of the integrated laser-based light source according to the invention shown in FIG. 2A.
Figure 2C:
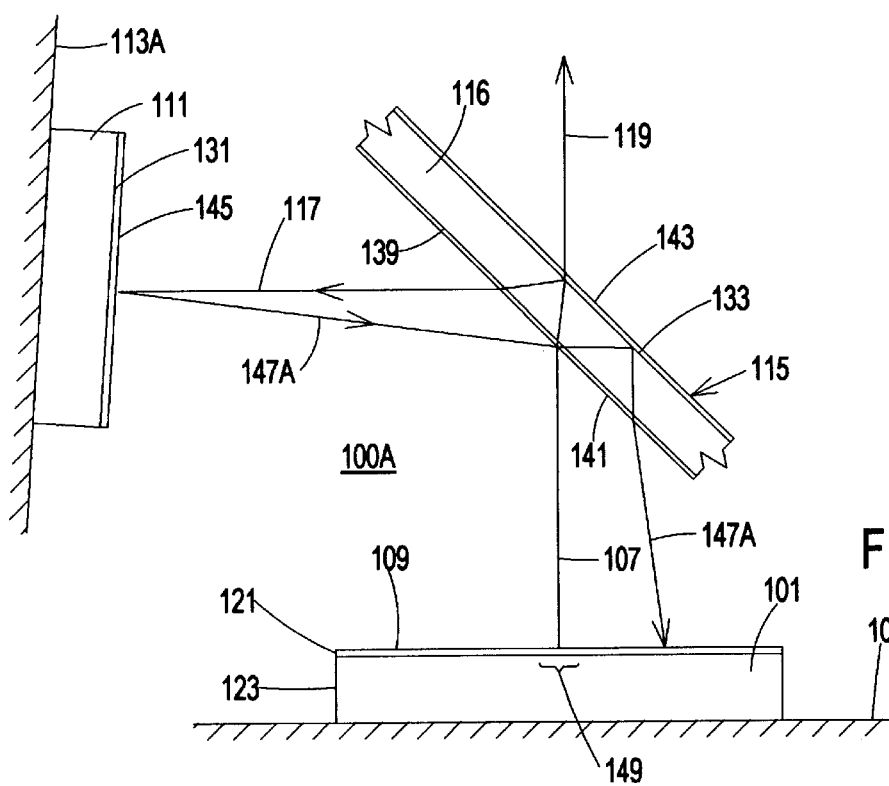
FIGS. 2C–2E show three alternative structures for attenuating the light re-entering the laser following reflection of the reflected light beam by the light sensor in the embodiment of the integrated laser-based light source according to the invention shown in FIG. 2A.
Figure 2D:
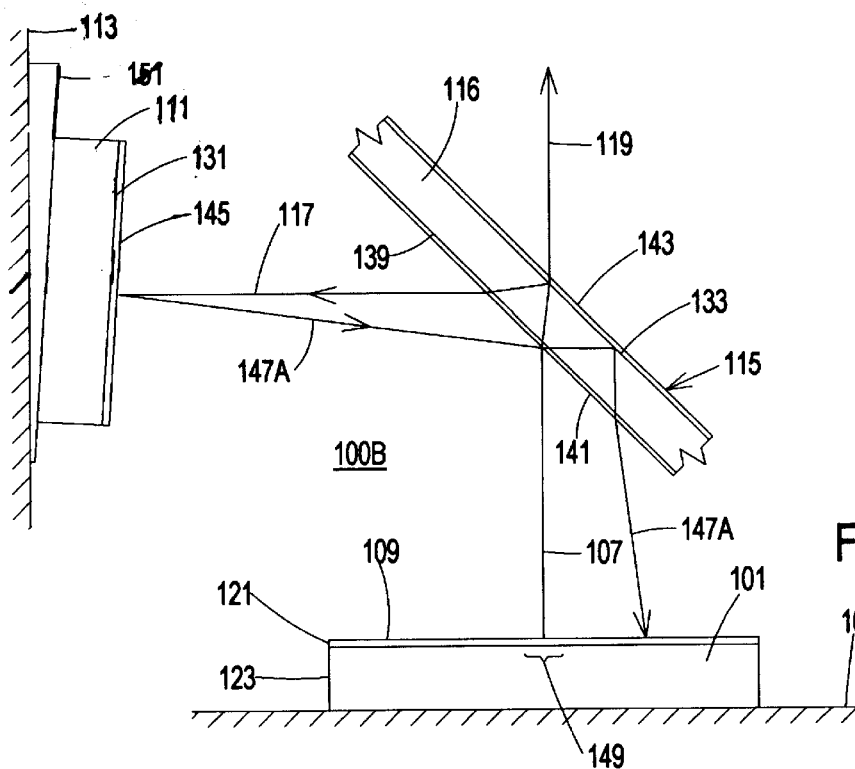
Figure 2E:
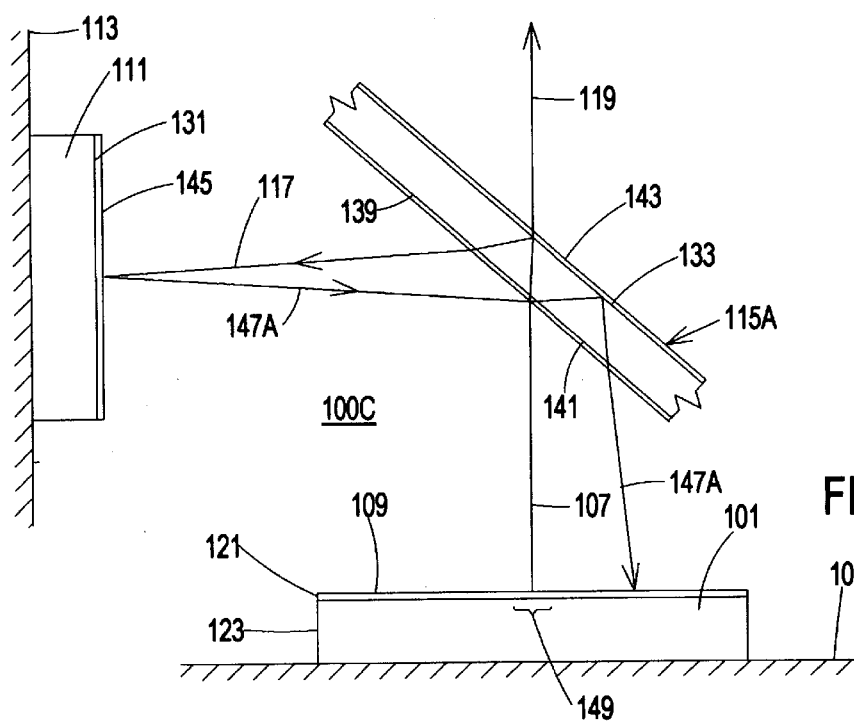
Figure 2F:
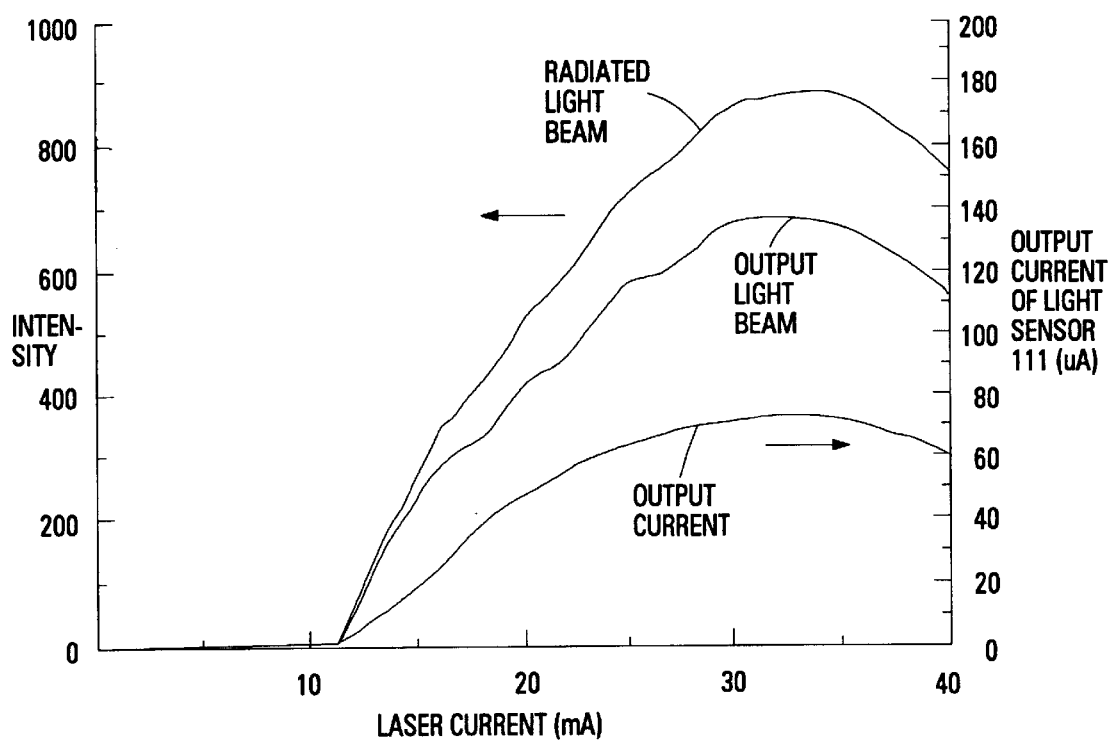
FIG. 2F is a graph showing the relationship between the intensity of the light beam generated by a sample VCSEL, the intensity of the output light beam, and the output current generated by the light sensor in response to the reflected light beam at different values of the current through the VCSEL in the embodiment of the integrated laser-based light source according to the invention shown in FIG. 2A.

FIG. 2F shows the relationship between the intensity of the radiated light beam 107 generated by a sample VCSEL, the intensity of the output light beam 119, and the output current generated by the light sensor 111 in response to the reflected light beam 117 at different values of the current through the VCSEL. It can be seen that the output current generated by the light sensor accurately tracks the intensity of the output light beam 119.

In the VCSEL-based light source 100, the VCSEL 101 is formed by delineating a conductive region in a layer structure obtained by epitaxially depositing several tens of layers (collectively indicated by the reference numeral 121) of semiconductor material on the substrate 123 to provide a light-generating layer sandwiched between two conductive mirror layers. The layer structure is described in detail in U.S. patent application Ser. No. 08/330,033, the disclosure of which is incorporated by reference, and is also described in some detail below with reference to FIGS. 8A and 8B.

The substrate 123 is mounted in electrical and physical contact with the header 103 of the package 105 using a suitable chip mounting technique, many of which are known in the art. A second electrical contact is made to the VCSEL 101 by the conductor 125 that passes through an electrically-isolated passage (not shown) in the header 103. The conductor 125 is connected to a metallization layer (not shown) on the VCSEL 101 by the bonding wire 126.

The VCSEL 101 generates the radiated light beam 107 in response to an electric current provided by the control circuit 127 and fed to the VCSEL via the conductors 125 and 126. For currents between a threshold value and a saturation value, the intensity of the light beam 107 is roughly proportional to the current (see FIG. 2F).

The light sensor 111 preferably has a conventional photo diode structure formed in silicon, gallium arsenide, indium gallium arsenide, or some other suitable material. The preferred material depends on the wavelength of the light beam 117. Other suitable light sensing elements, such as a solar cell, may alternatively be used for the light sensor 111. The light sensor is mounted on the post 113 using a suitable chip mounting technique, many of which are known in the art.

Preferably, the light sensor 111 is mounted in physical and electrical contact with the post 113, but may alternatively be electrically isolated from the post. A second electrical contact is made to the light sensor 111 by the conductor 129 which passes through an electrically-isolated passage (not shown) in the header 103. The conductor 129 is connected to a metallization layer (not shown) on the light sensor 111 by the bonding wire 130. Suitable circuitry (not shown) applies a reverse bias to the light sensor 111, and the output current from the light sensor, which depends on the intensity of the reflected light beam 117, is fed via the conductors 129 and 130 to the control circuit 127.

In response to the output current from the light sensor 111 and the digital input signal received via the input terminal 128, the control circuit 127 controls the current fed through the VCSEL 101 to that which maintains the intensity of the output light beam 119 at a predetermined level in one or both of the high light condition and in the low light condition. The circuitry of the control circuit 127 is conventional, and will not be described here. The control circuit may be mounted inside the package 105, in which case, the bonding wires 126 and 130 would be connected to the control circuit, and the conductors 125 and 129 would be used to transfer the input signal and power to the control circuit mounted on the header 103 in the package 105. The control circuit may also be integrated with the light sensor 111 or the VCSEL 101.

The light sensor 111 includes the light-receiving surface 131 through which the reflected light beam 117 derived from the radiated light beam 107 enters the light sensor. In the embodiment shown in FIG. 2A, the light sensor is mounted on the post 113 with the light-receiving surface 131 non-parallel to the light-emitting surface 109 of the VCSEL 101.

In this first embodiment, the plane beam splitter 115 includes the substrate 116 mounted in the path of the radiated light beam 107. The substrate 116 has two parallel surfaces, the beam-splitting surface 133 and the non-reflective surface 139. The beam-splitting surface reflects a fraction of the radiated light beam 107 generated by the VCSEL 101 as the reflected light beam 117, and transmits the remainder of the radiated light beam as the output light beam 119. In a practical embodiment, a piece of an optical flat about 2 mm square and about 200 μm thick was used as the substrate. Quartz or plastic could be used as alternative materials for the plane beam splitter.

The plane beam splitter 115 is mounted on the header 103, in which the groove 135 is formed at a distance from the plane of the post 113 approximately equal to the height of the post. The plane beam splitter 115 is then mounted with the edge 137 between the non-reflecting surface 139 and the beam-splitting surface 133 engaged in the groove 135, and part of the non-reflecting surface remote from the edge 137 resting on the post 113. The actual position of the groove 135 relative to the post 113 is set such that the reflected light beam 117 from the beam-splitting surface 133 of the plane beam splitter 115 impinges on the center of the light sensor 111. The plane beam splitter 115 is retained in position by a suitable adhesive or by clips (not shown) attached to the header 103 and/or the post 113. The groove 135 may be omitted, which enables an unmodified post-type header to be used.

The optical arrangement of the light source 100 is shown in greater detail in FIG. 2B. FIG. 2B shows the VCSEL 101 mounted on the part of the header 103, the light sensor 111 mounted on part of the post 113, which is attached to the header 103 as shown in FIG. 2A, and part of the plane beam splitter 115, which couples a fraction of the radiated light beam 107 generated by the VCSEL 101 into the light sensor 111 as the reflected light beam 117, and transmits the remainder of the radiated light beam 107 as the output light beam 119.

To control transmission and reflection by the beam splitter 115, a suitable anti-reflective layer 141 is deposited the non-reflecting surface 139 of the substrate 116. The non-reflecting surface is the surface of the substrate adjacent the VCSEL 101 and the light sensor 111. Suitable materials for the anti-reflective layer and procedures for determining the thickness of the anti-reflective layer according to the wavelength of the radiated light beam 107 generated by the VCSEL 101 are known in the art, and will therefore not be described here. The anti-reflective layer 141 minimizes reflection of the radiated light beam 107 at the non-reflecting surface 139 of the plane beam splitter. As a result, the radiated light beam passes through the non-reflecting surface and the substrate 116 to the beam-splitting surface 133, where the fraction of the radiated light beam 107 is reflected as the light beam 117, and the remainder of the radiated light beam is transmitted as the output light beam 119. In the practical embodiment referred to above, the anti-reflective layer 141 was omitted.

Alternatively, the surface of the substrate 116 adjacent the VCSEL 101 and the light sensor 111 may be used as the beam-splitting surface. In this case, an anti-reflective layer may be applied to the surface of the substrate remote from the VCSEL and the light sensor to maximize transmission of the output light beam 119. However, with this alternative arrangement, light reflected back to the VCSEL 101 from the light-receiving surface 131 of the light sensor cannot be attenuated by making the substrate light absorbent, as will be discussed in more detail below.

The fraction of the radiated light beam 107 reflected by the plane beam splitter 115 as the reflected light beam 117 depends on the reflectivity of the beam-splitting surface 133. The fraction of the light beam that needs to be reflected to enable the control circuit 127 to control the intensity of the output light beam without introducing noise into the output light beam depends on a trade-off between the efficiency of the device 100 (the reflected light beam 117 is diverted from the output light beam 119) and the signal-to-noise ratio of the electrical output of the light sensor 111. The intensity of the reflected light beam must be sufficiently high in relation to the sensitivity of the light sensor 111 to ensure that the output of the light sensor 111 has a signal-to-noise ratio that is sufficiently high to prevent operation of the control circuit 127 from degrading the signal-to-noise ratio of the output light beam.

In some applications, the intensity of the radiated light beam 107 and the sensitivity of the light detector 111 may both be sufficiently high for the 4% reflectivity of a glass-air boundary to provide the output signal from light sensor 111 with the desired signal-to-noise ratio. However, many common applications require the reflected light beam 117 to have an intensity in the range of 10–20% of that of the radiated light beam 107. Moreover, in applications in which the output light beam 119 has a low intensity, a reflectivity of greater than 20% may be required to provide the reflected light beam 117 with sufficient intensity. In other applications, the 4% reflectivity of the glass-air boundary may provide too much reflection. Thus, the reflection control layer 143 is deposited on the beam-splitting surface 133 of the plane beam splitter 115 to determine the reflectivity of the beam-splitting surface 133, and to set the intensity ratio between the reflected light beam 117 and the output light beam 119. Suitable materials for the reflection control layer and procedures for determining the thickness of the reflection control layer to reflect a desired fraction of the radiated light beam 107 are well known in the art, and will not be described here.

Another factor may also be used to determine the reflectivity of the beam-splitting surface 133. In some applications, the maximum intensity of the output light beam 119 must be limited for eye safety reasons. This maximum intensity may be less than the intensity at which some lasers generate the radiated light beam with a maximum signal-to-noise ratio. In these circumstances, the reflection control layer 143 can be designed to provide the beam-splitting surface 133 with a relatively high reflectivity. This enables the VCSEL 101 to be operated so that the radiated light beam 107 is generated at an intensity at which its signal-to-noise ratio is at or close to maximum. The reflectivity of the beam-splitting surface is then chosen to set the intensity of the output light beam to that which comfortably meets the safety standard. The beam-splitting surface reflects a majority of the radiated light beam towards the light sensor 111 and transmits a relatively small fraction of the radiated light beam as the output light beam. Despite its lower intensity, the output light beam has substantially the same signal-to-noise ratio as the radiated light beam because the beam-splitting surface equally attenuates both the radiated light beam and any noise in the radiated light beam. In this type of light source, the reflection control layer may provide the beam-splitting surface with a reflectivity of greater than 80% in some applications.

The intensity of the output light beam may be reduced relative to that of the radiated light beam not only by reflection by the beam splitting surface, but also by using a light-absorbing material for the substrate 116.

In this embodiment, and in all of the embodiments described in this disclosure, accurate control of the intensity of the light beam 119 by the control circuit 127 depends on the coupler 114 having a fixed transfer function between the radiated light beam 107 on one hand and the reflected light beam 117 and the output light beam 119 on the other hand. Since the reflectivity of the coupler's beam-splitting surface, which is a boundary such as a glass-air boundary, a quartz-air boundary, or a plastic-air boundary, or such boundaries coated with a metallized reflection-control layer, depends on the direction of polarization of the radiated light beam, it is important that the VCSEL 101 generate the radiated light beam with a defined direction of polarization to provide the coupler with a fixed transfer function. Otherwise, variations in the direction of polarization of the radiated light beam would cause the transfer function of the coupler to change. Any change in the transfer function of the coupler due to a change in the direction of polarization would cause the control circuit to change the intensity of the radiated light beam (and, hence of the output light beam) unnecessarily. VCSEL structures capable of generating the radiated light beam with a defined direction of polarization are described briefly below with reference to FIGS. 5A and 5B.

Additionally or alternatively, a series of dielectric layers may be used as the reflection-control layer on the beam-splitting surface of the coupler. The transfer function of such a beam-splitting surface is substantially independent of the direction of polarization of the radiated light beam.

The light sensor 111 has the anti-reflective layer 145 deposited on the light-receiving surface 131. The anti-reflective layer 145 both maximizes the detection efficiency of the light sensor 111, and minimizes the intensity of the reciprocal beam 147 reflected by the light-receiving surface of the light sensor. Although FIG. 2B shows the reciprocal beam 147 laterally offset from the light beams 117 and 107 for clarity, the reciprocal beam actually returns to the VCSEL 101 along the paths of the reflected light beam 117 and the radiated light beam 107. Along these paths, the reciprocal beam is partially reflected by the beam-splitting surface 133 of the plane beam splitter 115. The reciprocal beam 147 has the same wavelength as, but a different phase from, the radiated light beam 107 generated by the VCSEL 101 and therefore has the potential to impair the performance of the VCSEL, by, for example, degrading the signal-to-noise ratio of the radiated light beam 107. Minimizing the intensity of the reciprocal beam 147 reduces its ability to impair the performance of the VCSEL 101.

The ability of the reciprocal beam 147 to impair the performance of the VCSEL 101 can be further reduced by using light-absorbent glass for the substrate 116 of the plane beam splitter 115. The need for such additional precautions depends on a number of factors, including the reflectivity of the light-receiving surface 131 of the light sensor 111 and of the beam-splitting surface 133 of the plane beam splitter, and the susceptibility of the VCSEL to disturbance by an external light beam.

The plane beam splitter 115 also reduces the ability of any reflection of the output light beam 119 (for example, reflection from a face of the optical fibre into which the output light beam is coupled) to impair the performance of the VCSEL 101. The beam-splitting surface 133 of the plane beam splitter reflects a fraction of any reflection of the output light beam 119 and therefore reduces the intensity of the reflection of the output light beam 119 reaching the VCSEL 101. Using a light-absorbent glass for the substrate 116 further reduces the intensity of the reflection of the output light beam 119 reaching the VCSEL 101.

The ability of the reciprocal beam 147 to impair performance of the VCSEL 101 can also be reduced by mounting the light sensor 111 so that the reflected light beam 117 impinges on the light-receiving surface 131 at a nonzero angle of incidence, as shown in FIGS. 2C–2E. Mounting the light sensor so that the reflected light beam 117 impinges on the light-receiving surface at a non-zero angle of incidence causes the reciprocal beam 147A to travel back through the optical system on a path different from the paths of the light beams 107 and 117. As a result, most of the reciprocal beam impinges upon the VCSEL 101 outside the active area 149, which is only a few microns across, and the intensity of the reciprocal beam returning to the active area of the VCSEL after reflection by the light sensor is substantially reduced.

In the light source 100A shown in FIG. 2C, the angle of incidence of the reflected light beam 117 on the light sensor 111 is increased by bending the post 113A relative to the header 103 so that the part of the post on which the light sensor is mounted is not perpendicular to the header. In the embodiment 100B shown in FIG. 2D, the angle of incidence of the reflected light beam 117 on the light sensor 111 is increased by mounting the light sensor 111 on the angled pad 151, which, in turn, is mounted on the unmodified post 113. In the embodiment 100C shown in FIG. 2E, the plane beam splitter 115A is mounted at an angle different from 45° so that the reflected light beam impinges on the light sensor 111 mounted on the unmodified post 113 at a non-zero angle of incidence.

FIGS. 2B–2E also show how the radiated light beam 107 is refracted at the surfaces 133 and 139 of the plane beam splitter 115. As a result of this refraction, when the VCSEL 101 is mounted on the optical axis of the package 105, the output light beam 119 is emitted from a location laterally shifted relative to the optical axis. This shift can be especially problematical when the package 105 is mounted with its physical axis on the optical axis, and the output light beam is coupled to another component also located on the optical axis. The output light beam 119 can be restored to the physical axis of the package 105 by mounting the VCSEL on the header 103 in location appropriately offset from the physical axis.

Figure 3A:
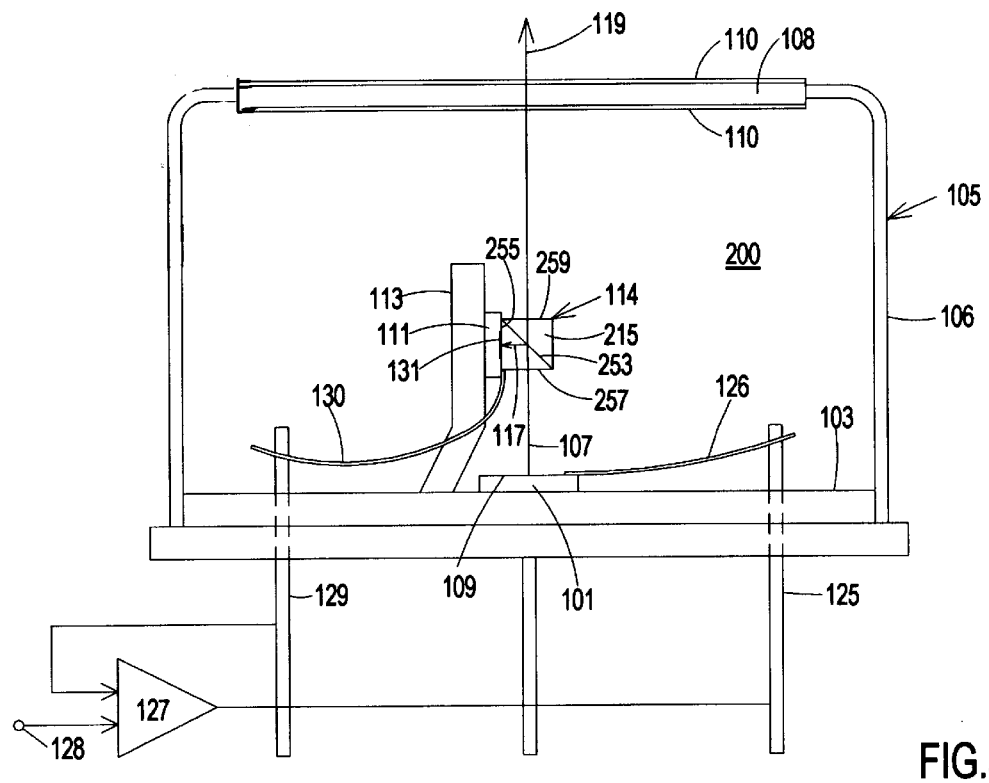
FIG. 3A shows a side view of a second embodiment of the integrated laser-based light source according to the invention.

FIG. 3A shows the light source 200, which is a second embodiment of the light source according to the invention, in which the cubic beam splitter 215 is used as the coupler 114 to couple a fraction of the radiated light beam 107 generated by the VCSEL 101 to the light sensor 111 as the reflected light beam 117 and to transmit the remainder of the radiated light beam 107 as the output light beam 119. In FIG. 3A, the same elements as those described above with respect to FIG. 2A are indicated by the same reference number, and will not be described again here.

The radiated light beam 107 generated by the VCSEL 101 enters and leaves the cubic beam splitter 215 at a zero angle of incidence, and is therefore not refracted by the beam splitter. Accordingly, when the VCSEL is mounted on the physical axis of the package 105, the output light beam 119 is emitted on this axis.

The reflectivity of the beam-splitting surface 253 of the cubic beam splitter 215 is controlled by a reflection control layer, which is a layer of metal or dielectric that determines the amount of the radiated light beam 107 reflected by the beam-splitting surface to generate the reflected light beam 117. The reflectivity of the beam-splitting surface 253 is chosen to set the intensity ratio between the reflected light beam 117 and the output light beam 119 in the same manner as that described above with reference to FIG. 2A.

In the embodiment shown in FIG. 3A, the cubic beam splitter 215 is mounted by attaching the surface 255 to the light-receiving surface 131 of the light sensor 111. An index-matching cement is preferably used for this purpose to minimize reflection at the boundary between the beam splitter and the light sensor. The surfaces 255, 257 and 259 of the beam splitter may be coated with an anti-reflective coating (not shown) to minimize the intensity of light reflected back into the VCSEL 101.

Figure 3B:
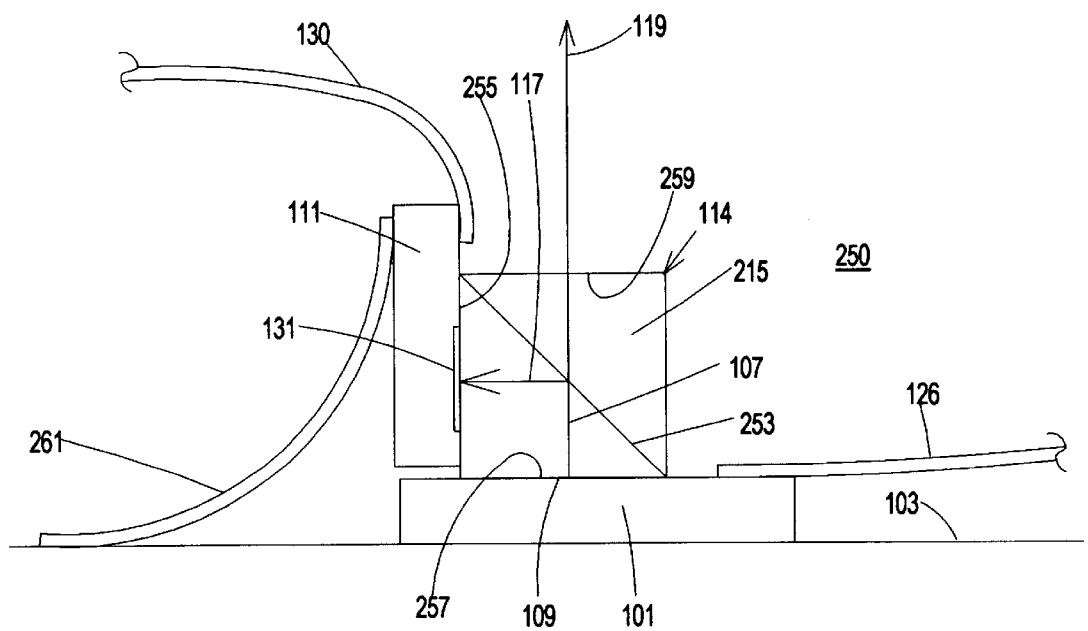
FIG. 3B shows details of a variation on the embodiment of the integrated laser-based light source according to the invention shown in FIG. 3A.

FIG. 3B shows part of the light source 250, which is a variation on the second embodiment of the light source according to the invention. The package 105 except part of the header 103 is omitted from FIG. 3B so that the arrangement of the VCSEL 101, the light sensor 111 and the cubic beam splitter 215 can be shown in more detail. The package and the connection of the bonding wires 126 and 130 to the conductors 125 and 129 is the same as shown in FIG. 3A.

In the variation shown in FIG. 3B, the header 103 is a standard header and lacks the post 113 used in the embodiments described above. The VCSEL 101 is mounted on the header 103, as described above with reference to FIG. 2A. The surface 257 of the cubic beam splitter 215 is attached to the light-emitting surface 109 of the VCSEL 101, and the light sensor 111 is attached to the surface 255 of the beam splitter. The beam splitter is attached to the VCSEL and the light sensor is attached to the beam splitter preferably using an index-matching cement. The surfaces 255, 257, and 259 are preferably coated with an anti-reflective layer to minimize the intensity of light reflected back into the VCSEL 101. The bonding wire 261 provides an electrical connection between the back of the light sensor 111 and the header 103.

In the variations shown in FIGS. 3A and 3B, the cubic beam splitter 215 may be constructed with the surface 255 non-orthogonal to the surfaces 257 and 259 to provide a non-zero angle of incidence between the reflected light beam 217 and both the surface 255 and the light-receiving surface 231 of the light sensor 111. Alternatively, the cubic beam splitter may be constructed with the beam-splitting surface 253 at an angle of incidence different from 45° to the radiated light beam 107 to provide a non-zero angle of incidence to the surface 255 and to the light-receiving surface 131 of the light sensor 111. A non-zero angle of incidence results in any light reflected by the surface 255 or the light-receiving surface 131 impinging on the VCSEL 101 outside its active area in a manner similar to that described above with respect to FIGS. 2C–2E.

A number of variations on a third embodiment of the light source according to the invention are shown in FIGS. 4A–4E. In FIGS. 4A–4E, the same elements as those shown in FIGS. 2A and 2B are indicated using the same reference numerals. In the third embodiment, a standard (no post) header is used, the light sensor is mounted on the header, and the VCSEL is mounted adjacent the light sensor with its light emitting surface substantially parallel to the light-receiving surface of the light sensor. A surface supported by the package re-directs a fraction of the radiated light beam generated by the VCSEL back to the light sensor by reflection or by back scattering to enable the light sensor to monitor the intensity of the output light beam.

The VCSEL and the light sensor may be mounted coaxially with one another on the header, or may be mounted side-by-side on the header. When separate chips are used for the VCSEL and the light sensor, and are mounted side-by-side, they are typically separated by between 0.2 and 1 mm. Alternatively, the VCSEL and the light sensor can be formed in a common piece of semiconductor material, in which case the separation between the elements may be less than the range set forth above. However, a separation of greater than 0.1 mm is preferable to reduce electrical and thermal crosstalk between the elements.

Electrical connections are made to the VCSEL and the light sensor in a similar manner to that described above with respect to FIG. 2A. The electrical output of the light sensor is fed to a control circuit similar to the control circuit 127 shown in FIG. 2A, but which has been omitted from the drawings of FIGS. 4A–4E to simplify these drawings. The control circuit controls the current fed to the VCSEL in the high light condition, or in the low light condition, or in both the high light condition and the low light condition, also as described above with reference to FIG. 2A.

In a first variation on the third embodiment of the light source according to the invention, a VCSEL and a light sensor are mounted side-by-side on the header of a package. The can of the package is fitted with a modified window. The modified window supports an angled portion, which serves as a coupler and couples a fraction of the radiated light beam generated by the VCSEL back to the light sensor as a reflected light beam, and transmits the remainder of the radiated light beam as an output beam. The angled portion is located in the window so that it is substantially centered on the radiated light beam. The angled portion has substantially plane and parallel surfaces that are set at such an angle relative to the radiated light beam that the reflected light beam reflected by the surface impinges on the light sensor. The window including the angled portion is a molding or pressing in quartz, glass, plastic or some other suitable material. In an alternative arrangement, the modified window may be omitted, and the angled portion may be directly supported by the can.

The surface of the angled portion may be coated with a reflection control layer, which is a metal or dielectric layer whose reflectivity is chosen to determine the relative intensities of the reflected light beam and the output beam, as described above with reference to FIG. 2A. The reflection control layer may be omitted in applications in which the intrinsic reflectivity of the surface provides the desired intensities.

A second variation uses a standard can with a standard window. These standard parts are lower in cost than the can with the modified window used in the first variation. The can is fitted with the insert. Otherwise the structure of the second variation is the same as that of the first variation, and will not be described further.

The insert includes an angled portion, which serves as a coupler, and couples a fraction of the radiated light beam generated by the VCSEL back to the light sensor as a reflected light beam, and transmits the remainder of the radiated light beam as an output beam. The angled portion is located in the insert so that it is substantially centered on the radiated light beam. The angled portion has substantially plane and parallel surfaces that are set at such an angle relative to the radiated light beam that the reflected light beam reflected by the surface impinges on the light sensor. The insert may be a molding or pressing in quartz, glass, plastic or some other suitable material.

The surface of the angled portion may be coated with a reflection control layer, which is a metal or dielectric layer whose reflectivity is chosen to determine the relative intensities of the reflected light beam and the output beam as described above with reference to FIG. 2A. The reflection control layer may be omitted in applications in which the intrinsic reflectivity of the surface provides the desired intensities.

The window is preferably coated with anti-reflective layers to prevent multiple reflections occurring between the window and the insert and to prevent the window from reflecting part of the output light beam back into the VCSEL.

Figure 4A:
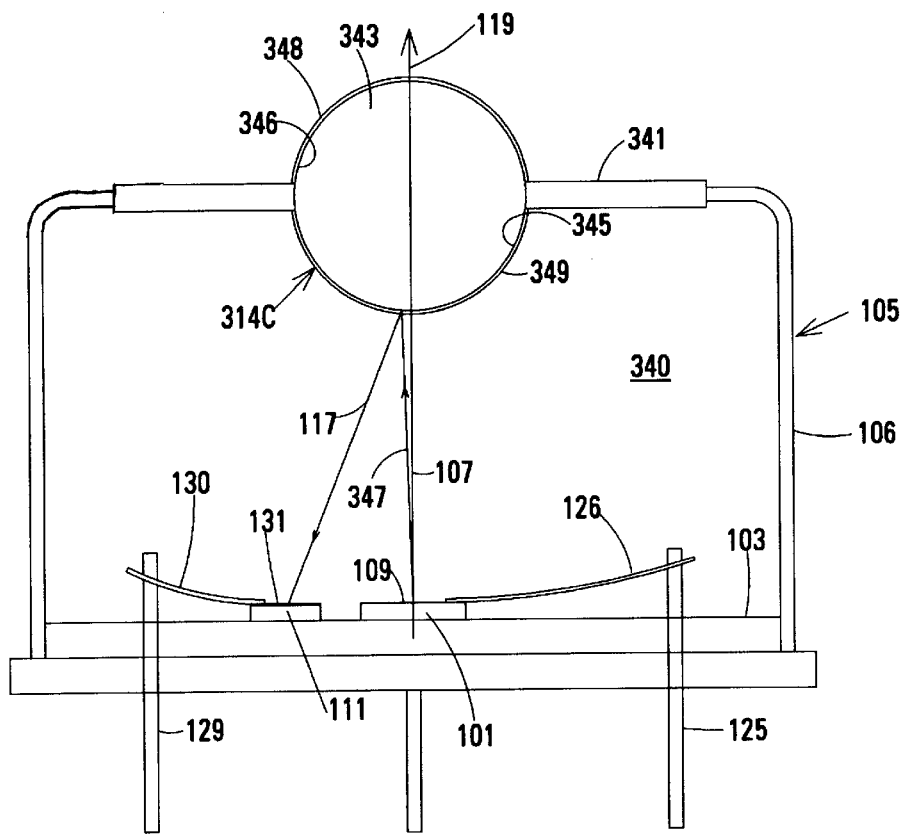
FIG. 4A shows a side view of a third variation on a third embodiment of the integrated laser-based light source according to the invention.

FIG. 4A shows the light source 340, a third variation, in which the VCSEL 101 and the light sensor 111 are mounted side-by-side on the header 103 of the package 105. The can 106 of the package supports the window 341 which supports the ball lens 343. The convex surface 345 of the ball lens 343 serves as the coupler 314C, and couples a fraction of the radiated light beam 107 generated by the VCSEL 101 back to the light sensor 111 as the reflected light beam 117, and transmits the remainder of the radiated light beam 107 as the output beam 119. The radiated light beam 107 diverges slightly as it radiates from the VCSEL 101. Thus, the outer parts of the light beam impinge on the beam-splitting surface 345 of the ball lens at a non-zero angle of incidence and are reflected by the beam-splitting surface 345 at an angle to the optical axis. For example, the outer part 347 of the radiated light beam 107 is reflected by the beam-splitting surface 345 at such an angle that the reflected light beam 117 impinges on the light sensor 111.

Using the convex surface 345 of the ball lens 343 as the coupler provides a number of advantages. Only an infinitely small segment of the convex surface is disposed at a zero angle of incidence to the radiated light beam 107. Thus, the convex surface minimizes the intensity of the reciprocal light beam returned to the VCSEL 101 following reflection of the reflected light beam 117 by the light receiving surface of the light sensor 111 and the convex surface. Also, the reflected light beam 117 diverges from the convex surface, which reduces the requirements on the accuracy with which the light sensor must be positioned relative to the VCSEL.

The window 341 and ball lens 383 may be a molding or pressing in glass, quartz, plastic, or some other suitable material. The ball lens may also be made of sapphire. In an alternative arrangement, the window may be omitted, and the ball lens may be directly supported by the can 106. In another alternative, the convex surface of a spherical or parabolic lens may be substituted for the convex surface of the ball lens as the convex beam-splitting surface 345.

The beam-splitting surface 345 of the ball lens 343 may be coated with the reflection control layer 349, a metal or dielectric layer which determines the reflectivity of the surface 345, and therefore determines the relative intensities of the reflected light beam 117 and the output light beam 119, as described above with reference to FIG. 2A. The surface 346 of the ball lens opposite the beam-splitting surface is preferably coated with the anti-reflective layer 348.

In the embodiment shown in FIG. 4A, only part of the reflected light beam 117 falls on the light detector 111. The rest of the reflected light beam is absorbed or reflected by the header 103 and the VCSEL 101. In the light source 350, a fourth variation shown in FIG. 4B, the large light sensor 351 is mounted on the header 103, and the VCSEL 101 is mounted in the center of the light-receiving surface 353 of the light sensor 351 preferably centered on the optical axis, to form the VCSEL/light sensor assembly 361. The part of the light-receiving surface 353 not covered by the VCSEL 101 and the track 417 (FIG. 5A) captures most of the reflected light beam 117, and, as a result, the light sensor generates an electrical output with a larger signal-to-noise ratio for a given intensity of the reflected light beam than the variation shown in FIG. 4A. Details of the VCSEL/light sensor assembly 361 will be described below with reference to FIGS. 5A and 5B.

Figure 4B:
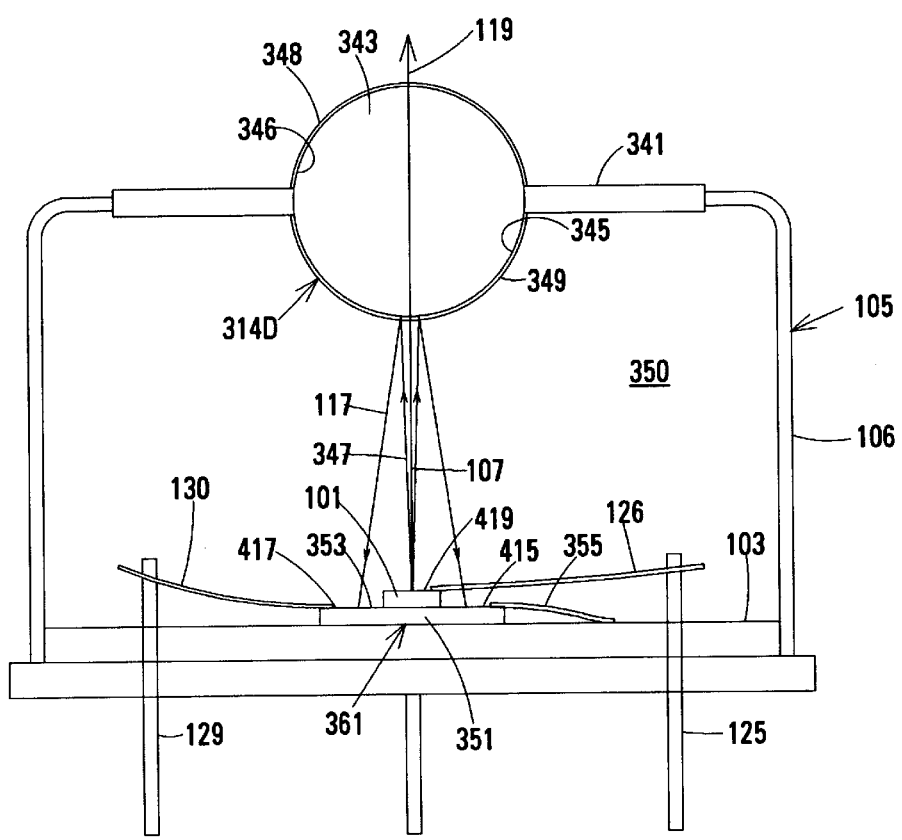
FIG. 4B shows a side view of a fourth variation on the third embodiment of the integrated laser-based light source according to the invention.

The VCSEL/light sensor assembly 361 is mounted with the conductive layer 407 (FIG. 5B) on the back of the light sensor 351 in physical and electrical contact with the header 103. The electrical output of the large light sensor 351 is connected to the conductor 129 by the bonding wire 130 connected between the conductor 129 and the bonding pad 411. The electrical current for the VCSEL 101 is connected from the conductor 125 by the bonding wire 126 connected between the conductor 125 and the conductive layer 419. The electrical circuit for the VCSEL is completed by connecting one end of the bonding wire 355 to the bonding pad 415. FIG. 4B shows the other end of the bonding wire 355 connected to the header 103. Alternatively, the VCSEL circuit may be electrically isolated from the light sensor circuit by connecting the other end of the bonding wire 355 to an additional conductor (not shown, but similar to the conductors 125 and 129) passing through an insulated passage (not shown) in the header 103.

With the exceptions noted above, the light source 350 shown in FIG. 4B is similar to that described above with reference to FIG. 4A and will not be described further.

Figure 4C:
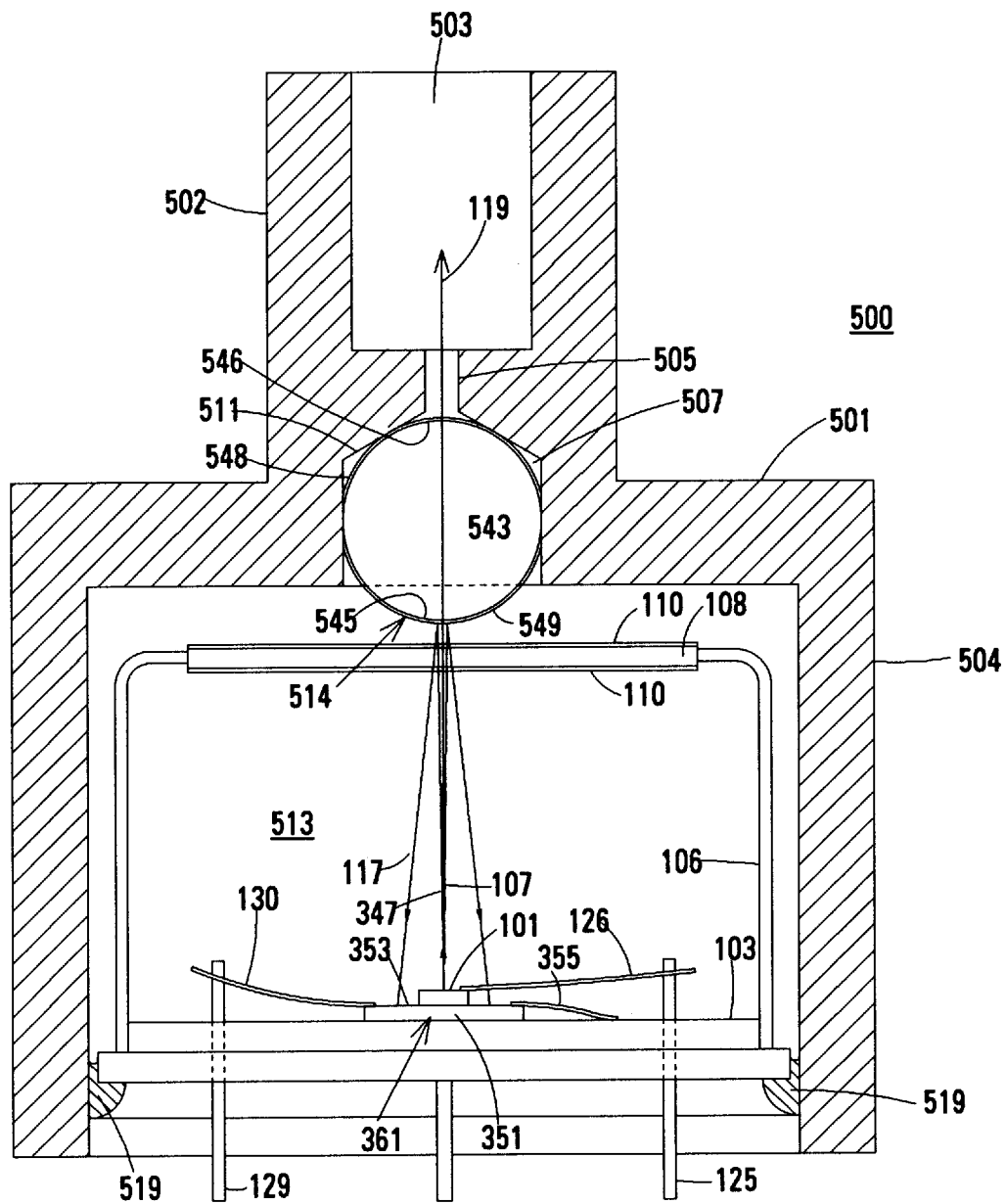
FIG. 4C shows a cross-sectional view of a fifth variation on the third embodiment of the integrated laser-based light source according to the invention.
Figure 4D:
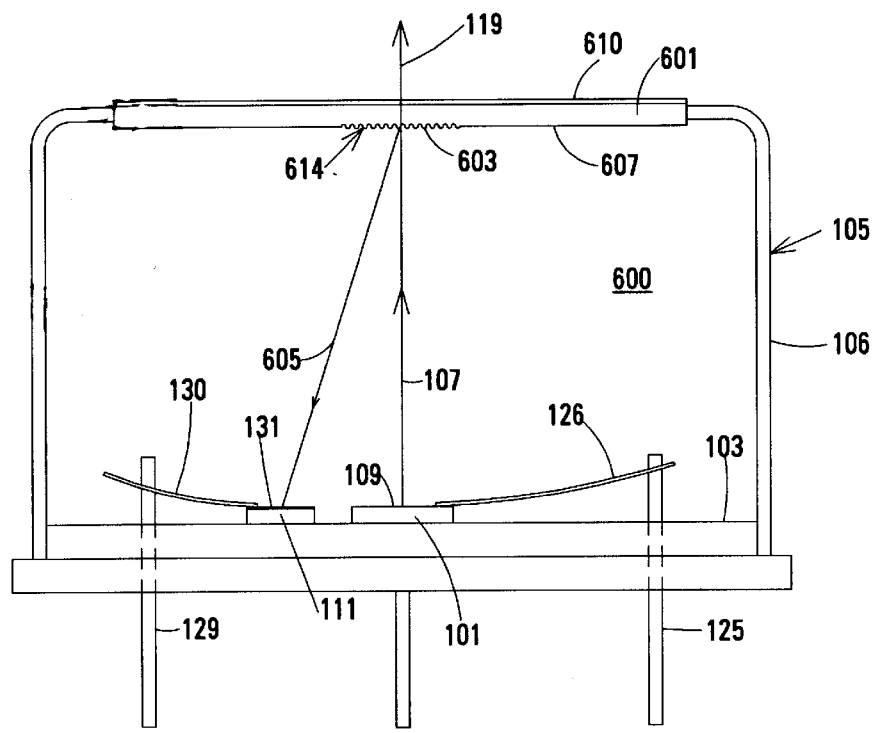
FIG. 4D shows a side view of a sixth variation of a third embodiment of the integrated laser-based light source according to the invention.
Figure 4E:
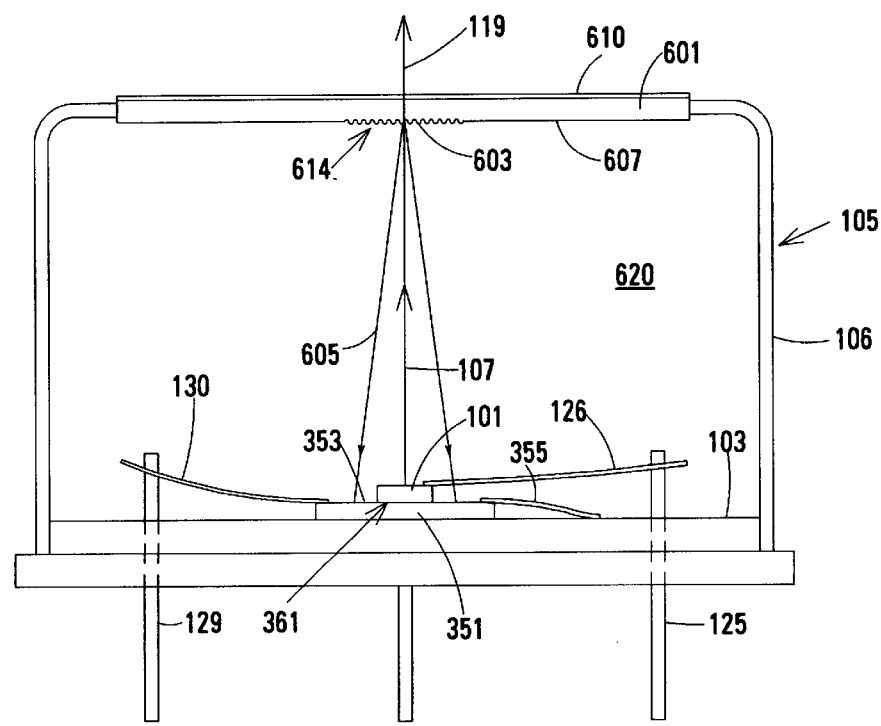
FIG. 4E shows a side view of a seventh variation of the third embodiment of the integrated laser-based light source according to the invention.
Figure 4F:
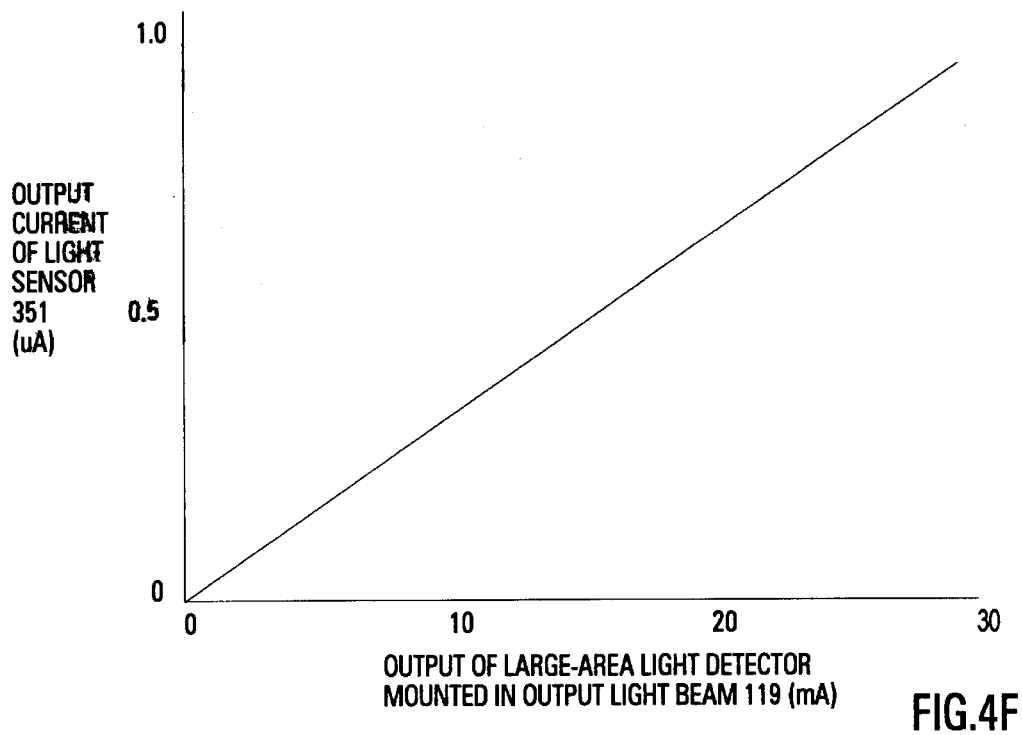
FIG. 4F is a graph showing the output current of the light detector plotted against the output of a large-area light detector mounted in the output light beam generated by the variation shown in FIG. 4B.

FIG. 4F is a graph showing the output current of the light sensor 351 plotted against the output of a large-area light detector mounted in the output light beam 119 generated by the embodiment shown in FIG. 4B. FIG. 4F shows a substantially linear relationship between the output of the light sensor 351 and the output of the light detector mounted in the output light beam, and indicates that the output of the light sensor 351 accurately represents the intensity of the output light beam 119.

In some applications, it is preferable not to have the ball lens 343 integral with the window 341 of the can 106, as in the embodiment shown in FIG. 4B, because accurate positioning of the components of such an arrangement is required to center the ball lens on the radiated light beam 107. FIG. 4C shows the light source 500, a fifth variation of the third embodiment of the laser-based light source according to the invention. This light source is intended primarily for use in an optical communication link. In FIG. 4C, elements similar to the elements described above with reference to FIG. 4B are indicated by the same reference numerals, and will not be described again here.

In the light source 500, the package 501 has a nose portion 502 and a body portion 504 disposed along an axis defining the optical axis. The bore 503 is formed in the nose portion concentric with the optical axis. The bore is precisely dimensioned to receive an optical fibre (not shown) in a manner that defines the lateral location of the optical fibre relative to the optical axis and that locates the end of the optical fibre at a fixed position on the optical axis.

The body portion 504 includes the cavity 507, which is accurately centered on the optical axis and is dimensioned to receive the ball lens 543. The ball lens is pressed into the cavity until it engages with the shoulder 511. This accurately defines the lateral and axial position of the ball lens on the optical axis. The passage 505 optically connects the cavity 507 to the bore 503. The cavity 507 in the body portion 504 accurately positions the ball lens 543 on the optical axis, and the cavity, together with bore 503 in the nose portion 502, define a fixed positional relationship between the optical fibre, the ball lens, and the optical axis.

The convex beam-splitting surface 545 of the ball lens 509 may be coated with the reflection control layer 549, a metal or dielectric layer which determines the reflectivity of the surface 545, and therefore determines the relative intensities of the reflected light beam 117 and the output light beam 119, as described above with reference to FIG. 2A. The surface 546 of the ball lens opposite the beam-splitting surface is preferably coated with the anti-reflective layer 548. A spherical or parabolic lens having a convex surface, or a gradient-index lens having a convex surface, mounted in the radiated light beam 107 with the convex surface aligned perpendicular to the optical axis, may substituted for the ball lens 509.

The body portion 504 of the package 501 accommodates the laser/light sensor sub-assembly 513. The laser/light sensor sub-assembly is similar to the light source shown in FIG. 4B, except that the window 108 in the can 106 is a standard window, and has plane, parallel faces disposed substantially perpendicular to the optical axis. The window 108 is preferably coated with the anti-reflective layers 110.

The laser/light sensor sub-assembly 513 is a clearance fit in the body portion 504 of the package 501, so that both the lateral and the axial positions of the laser/light sensor sub-assembly in the body portion can be adjusted. The laser/light sensor sub-assembly 513 is retained in position in the body portion 504 by the ring of adhesive 519.

During assembly, prior to curing the adhesive 519, the position of the laser/light sensor sub-assembly 513 is actively adjusted both axially and laterally relative to the optical axis to maximize the intensity of the output light beam 119. When the position of the laser/light sensor sub-assembly is optimum, the adhesive is cured to fix the laser/light sensor sub-assembly in position in the body portion 504. Optimizing the position of the laser/light sensor sub-assembly in the package 501 positions the VCSEL 101 on the optical axis of the package notwithstanding tolerances in the positioning of the VCSEL 101 on the light sensor 351 and in the positioning of the VCSEL/light sensor assembly 361 on the header 103.

With the exceptions noted above, the structure of the laser/light sensor sub-assembly 513 is the same as that described above with reference to FIG. 4B, and will therefore not be described again here.

In the light source 500 shown in FIG. 4C, the radiated light beam 107 generated by the VCSEL 101 diverges from the optical axis as it propagates along the optical axis, with the result that part of the radiated light beam 107 impinges on the ball lens 543 at a non-zero angle of incidence. The ball lens 543 serves as the coupler 514, and couples a fraction of the radiated light beam 107 generated by the VCSEL 101 back to the light sensor 351 as the reflected light beam 117, and transmits the remainder of the radiated light beam 107 as the output light beam 119. The reflected light beam 117 impinges on the light sensor 351, which generates an electrical signal indicative of the intensity of the reflected light beam. In response to the electrical signal generated by the light sensor, a control circuit (not shown) similar to that described above with reference to FIG. 2A controls the current fed to the VCSEL 101 to control the intensity of the output light beam 119 in one or both of the high light condition and the low light condition.

In an alternative arrangement of the light source 500 shown in FIG. 4C, the VCSEL and the light sensor may be mounted side-by-side on the header in an arrangement similar to that arrangement shown in FIG. 4A. In another alternative, the can 106 may be omitted.

A fraction of the light beam generated by the VCSEL can also be coupled to the light sensor by back scattering, as in the sixth and seventh variations on the third embodiment shown in FIGS. 4D and 4E. In the variations shown in FIGS. 4D and 4E, the same elements as those described above with reference to FIGS. 4A and 4B are indicated by the same reference numerals, and will not be described again here.

In the light sources shown in FIGS. 4D and 4E, a standard header 103 and can 106 are used, but the window 601 of the can includes the scattering portion 603 as the coupler 614. The coupler couples a fraction of the radiated light beam 107 generated by the VCSEL 101 back to the light sensor 111 or 351 as the scattered light 605, and transmits the remainder of the radiated light beam 107 as the output light beam 119. In a practical embodiment, the scattering portion 603 was formed by frosting the surface 607 of the window 601. Light may alternatively be scattered by the window 601 by forming a weak diffraction grating (not shown) on one of the surfaces of the window or by other means. The surface of the window 601 remote from the VCSEL 101 is preferably coated with the anti-reflective layer 610.

In the light source shown in FIG. 4D, the VCSEL 101 and the light sensor 111 are mounted side-by-side on the header 103, as described above with reference to FIG. 4A. In the light source shown in FIG. 4E, the VCSEL 101 is mounted in the center of the large-area light sensor 351, as described above with reference to FIG. 4B.

Either of the variations just described can be modified to use a standard windowed can, such as the windowed can shown in FIG. 4C, can by forming the scattering portion on the surface of an insert fitted into the can between the VCSEL 101 and the window of the can. The surface of the insert opposite the scattering portion would preferably be coated with an anti-reflective layer.

Figure 5A:
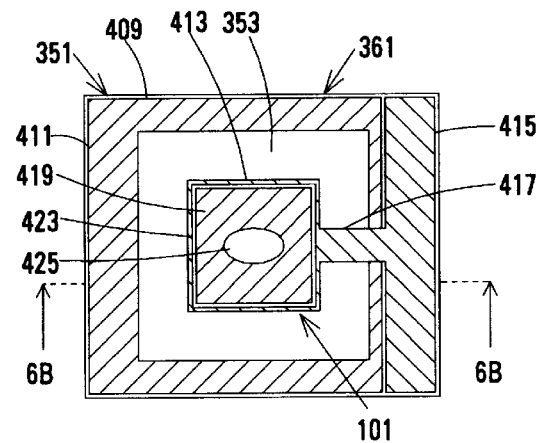
FIGS. 5A and 5B respectively show a top view and a cross sectional view of the VCSEL/light sensor assembly used in the variations shown in FIGS. 4B, 4C and 4E.
Figure 5B:
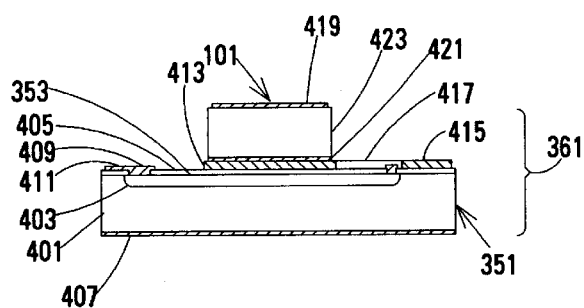

The VCSEL/light sensor assembly 361 used in the embodiments described above with reference to FIGS. 4B, 4C and 4E will now be described with reference to FIGS. 5A and 5B. In the large light sensor 351, the substrate 401 is a semiconductor material, such as silicon, gallium arsenide, etc. In the preferred embodiment, the substrate is a piece of silicon about 1.5 mm square. The region 403 is formed under the light-receiving surface 353 in the substrate 401. The region 403 has the opposite conductivity mode to that of the substrate. The insulating layer 405 is deposited on the light-receiving surface of the substrate, and the conductive layer 407 is deposited on the opposite surface of the substrate. In the preferred embodiment, the insulating layer is a layer of silicon dioxide, and the conductive layer 407 is a layer of aluminum or gold. The metallization layer 409 contacts the region 403 through holes in the insulating layer 405 and connects the region 403 to the bonding pad 411 on the surface of the insulating layer. When a reverse bias is applied between the bonding pad 411 and the conductive layer 407, current flows in proportion to the intensity of the light falling on the light-receiving surface 353.

The mounting pad 413 is deposited on the insulating layer 405 in the center of the light-receiving surface 353 and is connected to the bonding pad 415 by the track 417. In the preferred embodiment, the metallization layer 409, the mounting pad 413, the bonding pads 411 and 415, and the track 417 were formed in a single metallization operation.

The VCSEL 101 has the conductive layers 419 and 421 deposited on opposite faces of the substrate/mirror structure 423. In the preferred embodiment, the substrate/mirror structure 423 is about 0.5 mm square. Further details of the substrate/mirror structure are set forth below with reference to FIGS. 8A and 8B. The light generated by the VCSEL 101 exits the device through the light emission port 425 in the conductive layer 419.

The VCSEL 101 is mounted in the center of the mounting pad 413 using a suitable chip mounting technique so that the conductive layer 421 physically and electrically contacts the mounting pad. In the preferred embodiment, a conductive epoxy adhesive was used for this purpose.

Figure 6A:
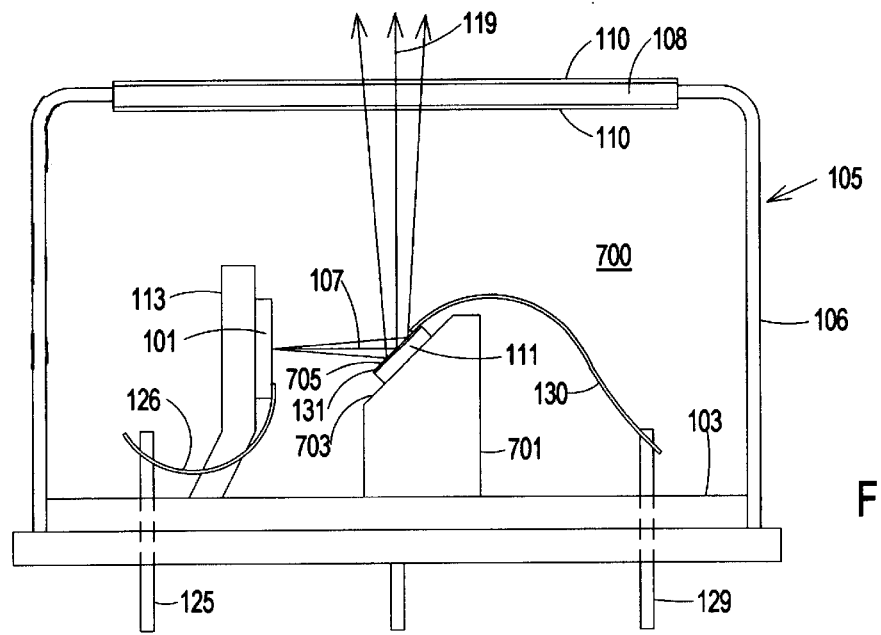
FIG. 6A shows a side view of a fourth embodiment of the integrated laser-based light source according to the invention.
Figure 6B:
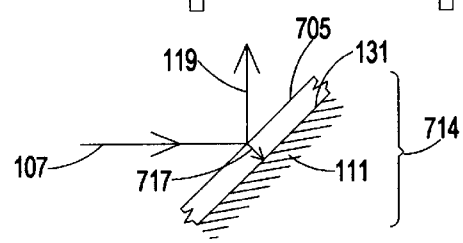
FIG. 6B shows details of the optical arrangement of the fourth embodiment of the integrated laser-based light source according to the invention.

A fourth embodiment 700 of the laser-based light source according to the invention is shown in FIGS. 6A and 6B. In FIGS. 6A and 6B, elements that are the same as the elements described above with reference to FIG. 2A are indicated by the same reference number. In the fourth embodiment, the coupler 714 is a beam-splitting layer formed on the surface of the light sensor. The coupler couples the fraction of the radiated light beam to the light sensor by transmission, and reflects the remainder of the radiated light beam as the output light beam.

In the light source 700 shown in FIGS. 6A and 6B, a post-type header 103 similar to the post-type header used in the embodiment shown in FIG. 2A is used. However, in this embodiment, the VCSEL 101 is mounted on the post 113 and emits the radiated light beam 107 substantially parallel to the header 103. The platform 701, which includes the angled face 703, is mounted on the header 103 with the angled face facing the VCSEL 101. The platform is dimensioned and mounted on the header such that the radiated light beam 107 generated by the VCSEL 101 impinges on the center of the angled face 703.

The light sensor 111 is mounted on the angled face 703 of the platform 701 in a position in which the radiated light beam 107 impinges in the center of the light-receiving surface 131. The beam-splitting layer 705 is deposited on the surface of the light sensor 111, and which serves as the coupler 714. The coupler couples a fraction of the radiated light beam 107 generated by the VCSEL 101 to the light sensor 111 as the transmitted light beam 717, and reflects the remainder of the radiated light beam 107 as the output light beam 119, as shown in FIG. 6B. The angled face 703 is preferably set at such an angle relative to the direction of the radiated light beam 107 that the output light beam 119 reflected by the beam-splitting surface 705 radiates in a direction substantially perpendicular to the header 103. In a practical embodiment, the angled face 703 was angled at about 45° to the radiated light beam 107.

The output light beam 119 exits the package 105 through the window 108 in the can 106. The window may be coated with the anti-reflective layers 110 to prevent the window from reflecting part of the output light beam back into the VCSEL 101.

The transmitted light beam 717, which is the fraction of the radiated light beam 107 transmitted by the beam-splitting layer 705, impinges on the light-receiving surface 131 of the light sensor 111. The lights sensor generates an electrical signal indicative of the intensity of the transmitted light beam 717, in a manner similar to that described above with reference to FIG. 2A. In response to the electrical signal generated by the light sensor, a control circuit similar to that described above can control the current fed to the VCSEL 101 to define the intensity of the output light beam 119 in one or both of the high light condition and the low light condition.

The reflectivity of the beam-splitting layer 705 is chosen to provide the desired intensity ratio between the transmitted light beam 717 and the output light beam 119. In applications in which the signal-to-noise ratio of the output light beam 119 is increased by making the reflectivity of the beam-splitting surface relatively low, so that most of the radiated light beam 107 generated by the VCSEL 101 is not reflected as the output light beam, as described above, the light-receiving surface 131 of the light sensor may include an absorptive layer (not shown) under the beam-splitting layer 705. The absorptive layer prevents saturation of the light sensor 111 by the transmitted light beam 717, and prevents the intensity of the output light beam 119 from being augmented by the light-receiving surface 131 reflecting the transmitted light beam 717.

As an alternative to the beam-splitting layer 705 deposited on the light receiving surface of the light sensor 111, a beam splitter may be disposed between the VCSEL 101 and the light sensor 111 at a non-zero angle of incidence to the radiated light beam. A beam splitter similar to the plane beam splitter 115 shown in FIG. 2A may be used. The beam splitter transmits the fraction of the radiated light beam to the light sensor as the transmitted light beam, and reflects the remainder of the radiated light beam as the output light beam. The beam splitter may be supported by the light receiving surface of the light sensor, or may be supported by the header independently of the light sensor. In the latter case, the light sensor may be mounted with the light receiving surface generally perpendicular to the transmitted light beam.

Figure 6C:
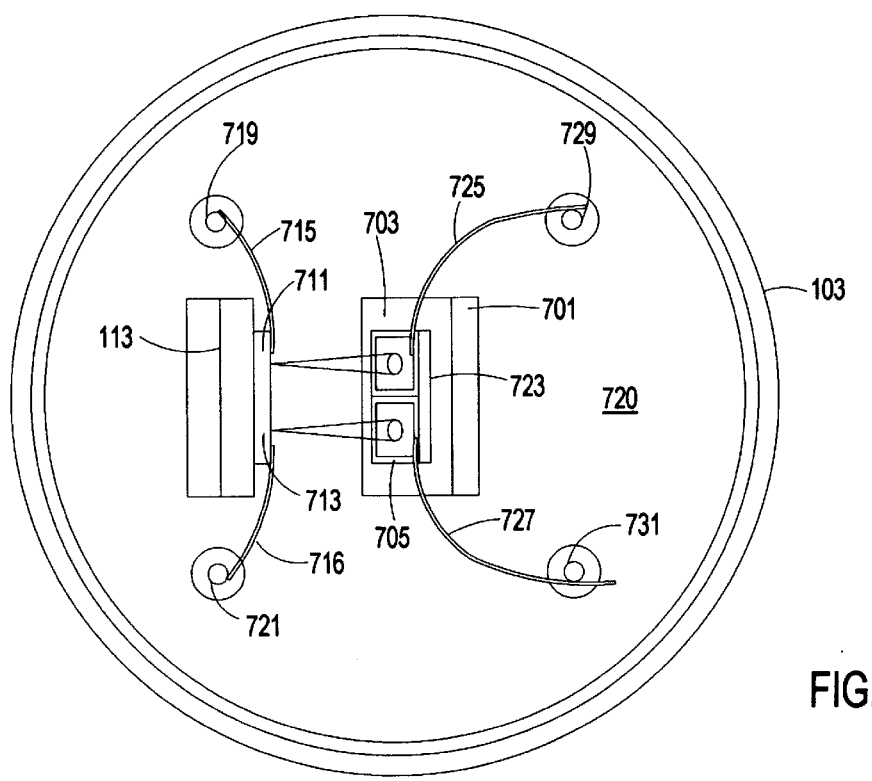
FIG. 6C shows a top view of the fourth embodiment of the integrated laser-based light source according to the invention adapted to operate with an array of lasers.

The close coupling between the VCSEL 101 and the light sensor 111 makes this embodiment especially suitable for controlling the intensities of the VCSELs in an array of VCSELs. The embodiments shown in FIGS. 2A–2E, 3A, 3B, and 4A are also suitable for controlling the intensities of the VCSELs in an array of VCSELs. An adaptation 720 the embodiment shown in FIGS. 6A and 6B for use with an array of VCSELs is shown in FIG. 6C, which shows a two-element VCSEL array as an example. In the laser-based light source 720 shown in FIG. 6C, the VCSELs 711 and 713 are formed side-by-side in a common layer structure mounted on the post 113. The two-VCSEL structure shown below in FIG. 8B can be used for this purpose. Alternatively, two discrete VCSELs could be mounted side-by-side on the post 113. Separate electrical connections to the VCSELs are made by the bonding wires 715 and 716 and the conductors 719 and 721, respectively.

Although discrete light sensors could be mounted side by-side on the angled face 703 of the platform 701, the drawing shows the integrated light sensor array 723. In the light sensor, light sensors normally equal in number to the number of VCSELs in the VCSEL array (two are shown as an example in FIG. 6C) are formed in a common substrate. The common beam splitting layer 705 is formed on the surface of the light sensor array. Separate electrical connections to the elements of the light sensor array are made by the bonding wires 725 and 727 and the conductors 729 and 731, respectively. The electrical output of each light sensor in the light sensor array 723 is used in the manner described above to control the light output of the VCSEL that generates the radiated light beam impinging on the light sensor.

Figure 7:
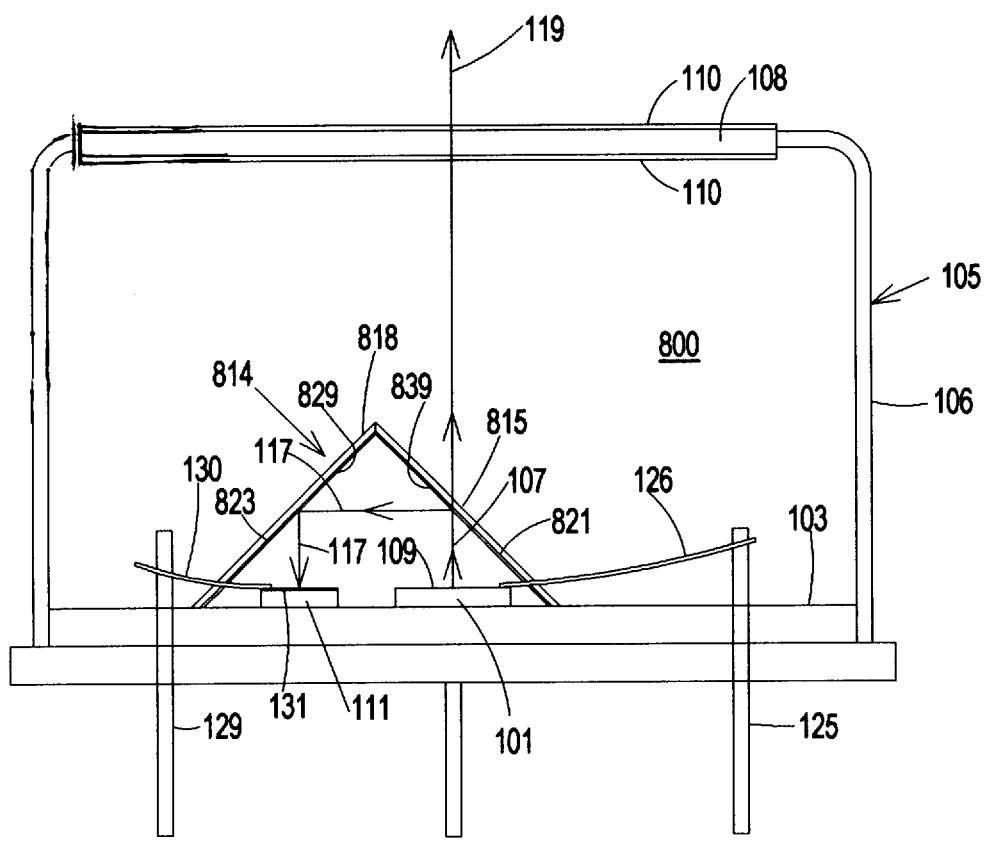
FIG. 7 is a side view of a fifth embodiment of the integrated laser-based light source according to the invention.

A fifth embodiment 800 of the laser-based light source according to the invention will now be described with reference to FIG. 7. In the fifth embodiment, the VCSEL and the light sensor are mounted side-by-side on the header with the light emitting surface of the VCSEL substantially parallel to the light-receiving surface of the light sensor, and multiple surfaces are used as the coupler to couple a fraction of the radiated light beam generated by the VCSEL to the light sensor and to provide the remainder of the radiated light beam as the output light beam. In the embodiment shown in FIG. 7, elements corresponding to those shown in FIG. 2A are indicated by the same reference numerals, and will not be described again here.

The VCSEL 101 and the light sensor 111 are mounted side-by-side on the header 103, which is enclosed by the can 106 that includes the window 108 that preferably includes the anti-reflection layers 110. The plane beam splitter 815 and the reflector 818 constitute the coupler 814, which couples a fraction of the radiated light beam 107 generated by the VCSEL 101 into the light sensor 111 as the reflected light beam 117, and transmits the remainder of the output light beam as the output light beam 119.

The plane beam splitter 815 includes the beam-splitting surface 821 which is partly reflective and reflects the fraction of the radiated light beam 107 generated by the VCSEL 101 towards the reflecting surface 823 of the reflector 818 as the reflected light beam 117. The beam-splitting surface also transmits the remainder of the radiated light beam 107 generated by the VCSEL as the output light beam 119. The reflected light beam travels approximately parallel to the header 103 until it reaches the reflecting surface 823. The reflecting surface 823 is fully reflecting, and reflects the reflected light beam 117 received from the beam-splitting surface into the light sensor 111. In response to the reflected light beam, the light sensor generates an output current whose magnitude is determined by the intensity of the reflected light beam.

The metallization layer 829 is deposited on the reflecting surface 823 of the reflector 818 to increase the reflectivity of the reflecting surface to close to 100%.

In most applications, the reflection control layer 839 is deposited on the beam-splitting surface 821 of the plane beam splitter 815 to set the reflectivity of the beam-splitting surface to that which provides the desired intensities of the reflected light beam 117 and the output light beam 119, as described above with reference to FIG. 2A.

In a practical embodiment, two small pieces of a glass optical flat cemented to one another and to the header can be used as the plane beam splitter 815 and the reflector 818 constituting the coupler 814. The plane beam splitter and the reflector are preferably mounted orthogonally to one another but at angles slightly different from 135° and 45° relative to the header 103 to direct the reflected light beam 117 into the light sensor 111 at a non-zero angle of incidence. This prevents reflections of the reflected light beam at the light receiving surface 131 of the light sensor from returning to the VCSEL 101. The pieces of optical flat would be coated with the reflection control layer 839 and the metallization layer 829 prior to assembling the coupler.

The VCSEL 101 and the light sensor 111 could be incorporated in the same piece of semiconductor material. For example, the VCSEL and additional laser structure formed in the layer structure 803 shown in FIGS. 8A and 8B could be used.

Figure 8A:
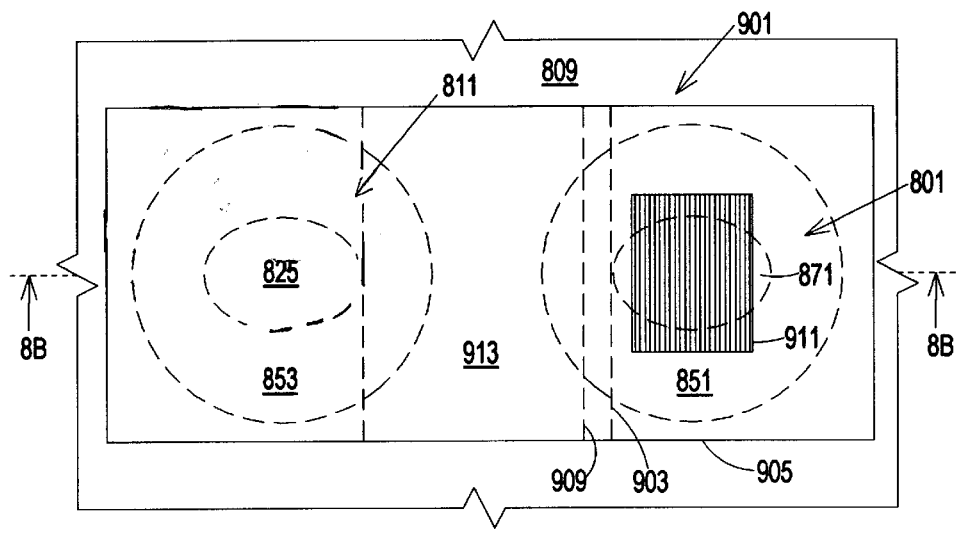
FIGS. 8A and 8B respectively show a top view and a cross-sectional view of a sixth embodiment of the integrated laser-based light source according to the invention.
Figure 8B:
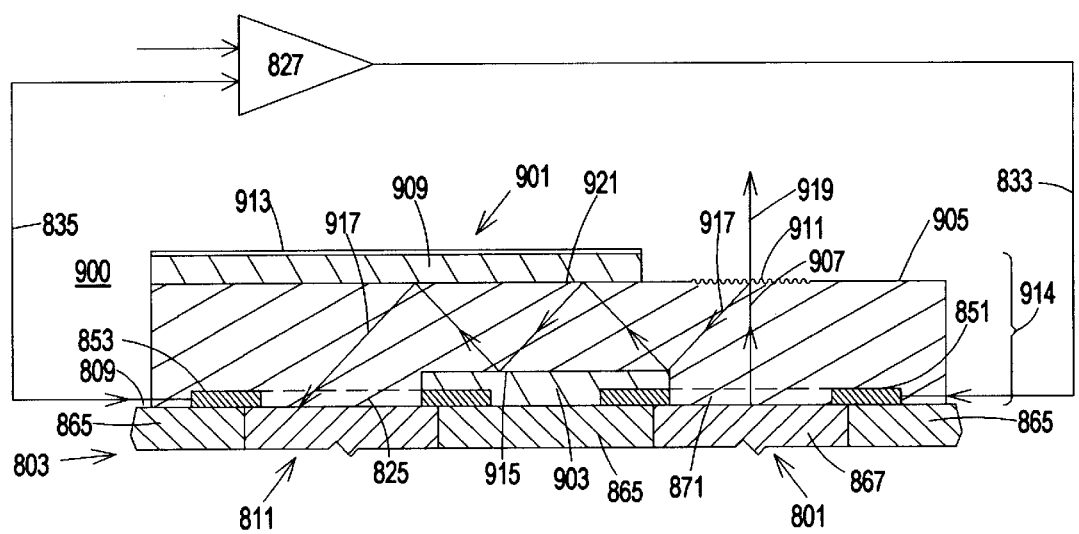

A sixth embodiment of the invention is shown in FIGS. 8A and 8B. Like the fifth embodiment, the sixth embodiment of the light source according to the invention uses multiple surfaces to couple a fraction of the radiated light beam into the light sensor. However, in the sixth embodiment, a thin-film optical waveguide formed on the semiconductor layer structure in which both the VCSEL and the light sensor are formed is used as the coupler. This simplifies the alignment of the coupler relative to the VCSEL and the light sensor during manufacture.

The light source 900, the sixth embodiment of the laser-based light source according to the invention, is shown in FIGS. 8A and 8B. FIGS. 8A and 8B respectively show a view of the exposed surface 809 of the layer structure 803 and a simplified cross section of part of the layer structure 803 adjacent the exposed surface 809. Details of the layer structure are set forth in U.S. patent application Ser. No. 08/551,302, the disclosure of which is incorporated herein by reference. The layer structure is formed on a substrate (not shown) which is mounted on the header (not shown) of a package (not shown) substantially similar to the package 105 shown in FIG. 7. The header, the package, and the connections between the elements formed in the layer structure 803 and the conductors of the package are omitted from FIGS. 8A and 8B to simplify the drawing.

The VCSEL 801 and the additional laser structure 811 are defined in the layer structure 803 by the reduced-conductivity region 865 in the layer structure, and by the electrodes 851 and 853 formed on the exposed surface 809 of the layer structure. The additional laser structure is structurally similar to the VCSEL, and is electrically isolated from the VCSEL by the reduced-conductivity region. The electrode 851 of the VCSEL bounds the light-emitting port 871 from which the VCSEL emits the radiated light beam 907. The electrode 853 of the additional laser structure bounds the light receiving port 825 through which the additional laser structure receives the light beam 917.

Typically, the additional laser structure 811 and the VCSEL 801 are physically separated from one another in the layer structure 803 by a distance of the order of 100 μm. When subject to a reverse bias opposite in polarity to the electrical potential driving the laser current through the VCSEL 801, the additional laser structure 811 operates as a light sensor.

In the light source 900 shown in FIGS. 8A and 8B, the thin-film optical waveguide 901 incorporating the weak diffraction grating 911 operates as the coupler 914 and couples a fraction of the radiated light beam 907 generated by the VCSEL 801 to the additional laser structure 811 as the light beam 917. The additional laser structure operates under reverse bias as a light sensor. The coupler 914 also transmits the remainder of the radiated light beam 907 as the output light beam 919.

In the thin-film optical waveguide 901, the first cladding layer 903 is deposited on part of the exposed surface 809 of the layer structure 803 between the VCSEL 801 and the additional laser structure 811. The core layer 905 overlays the first cladding layer and additionally overlays the light emission port 871 of the VCSEL and the light-receiving port 825 of the additional laser structure. The core layer has a higher refractive index than the first cladding layer. The part of the core layer overlaying the light emission port of the VCSEL includes the weak diffraction grating 911.

The second cladding layer 909 overlays the part of the core layer 905 overlaying the first cladding layer 903 and the light-receiving port 825 of the additional laser structure 811. The second cladding layer is preferably coated with the metallization layer 913, which prevents stray light from outside the optical waveguide 901 from entering and being detected by the additional laser structure.

To ensure a constant relationship between the intensity of the output light beam 919 and the intensity of the light beam 917 received by the light receiving port 825 of the additional laser structure 811, either the VCSEL 801 must generate the radiated light beam 807 with a fixed direction of polarization or the surfaces 915 and 921 of the optical waveguide 901 must have direction of polarization-independent reflectivities. In the embodiment shown in FIG. 8A, the light emitting port 871 of the VCSEL is elliptical, which causes the VCSEL to generate the radiated light beam with a fixed direction of polarization. Making the light emitting port and/or the core region 867 elliptical or some other rotationally asymmetrical shape fixes the direction of polarization of the radiated light beam to coincide with the direction of the larger dimension of the asymmetrical shape.

The light source 900 may be simplified by omitting the second cladding layer 909. In this case, the metallization layer 913 is preferably deposited on the core layer 905 outside the diffraction grating 911.

Each of the layers of the thin-film optical waveguide 901 is formed by spinning a layer of a liquid plastic onto the exposed surface 809 of the layer structure 803, baking the plastic layer, and then using a mask-and-etch process to define the shape of the layer of the optical waveguide in the plastic layer. This process is performed once for each of the layers of the optical waveguide. The plastic used for the core layer has a higher refractive index than that used for the two cladding layers. In a practical embodiment, the plastic spun onto the surface of the layer structure was a polyimide sold under the brand name Poly-guide™ by Dupont, Inc. The weak diffraction grating 911 was formed in the core layer 905 by a selective etching process.

The weak diffraction grating 911 back-diffracts the fraction of the radiated light beam 907 towards the additional laser structure 811. The remainder of the radiated light beam 907 is not diffracted, and passes through the diffraction grating 911 as the output light beam 919.

The light beam 917 travels from the diffraction grating 911 through the optical waveguide 901, travelling along the core layer 905 towards the additional laser structure 811 and across the core layer towards the boundary 915 between the core layer and the first cladding layer 903. The pitch of the weak diffraction grating 911 is designed so that the light beam 917 is diffracted at such an angle that it impinges on the boundary 915 at an angle greater than the boundary's critical angle. As a result, the light beam 917 is totally internally reflected at the boundary, and travels back across the core layer 905 until it reaches the boundary 921 of the core layer and the second cladding layer 909, where it is again totally internally reflected. The light beam 917 travels along the optical waveguide by repeated reflection at the core/cladding boundaries 915 and 921 until it reaches the light-receiving port 825 of the additional laser structure 811. The first cladding layer does not cover the light-receiving port 825, so the light beam 917 enters the light-receiving port.

The light beam 917 entering the light-receiving port 825 causes an output current representing the intensity of the light beam 917 to flow through the additional laser structure 811 via the conductor schematically represented by the line 835. In response to the output current of the additional laser structure, the control circuit 827 feeds current to the VCSEL 801 via the conductor schematically represented by the line 833. This current causes the VCSEL to generate the radiated light beam 907 with such an intensity that the output current from the additional laser structure is maintained at a predetermined value in one or both of the high light condition and the low light condition. This corresponds to the output light beam 919 respectively having a predetermined intensity in the high light condition, or in the low light condition, or in both the high light condition and the low light condition, as described above with respect to FIG. 2A.

The control circuit 827 may include circuitry to compensate for the nonlinear light intensity to output current characteristic of the additional laser structure 811. The control circuit may additionally include circuitry to limit the intensity of the output light beam 919 in the high light condition to a predetermined maximum intensity, corresponding to a predetermined maximum output current of the additional laser structure 811.

An array of intensity-controlled VCSELs may be made in a common layer structure by patterning the non-conductive layer 865 and the layer in which the electrodes 851 and 853 are formed to define multiple VCSELs similar to the VCSEL 801 and multiple additional laser structures similar to the additional laser structure 811. The layers constituting the optical waveguide 901 can then be patterned to form multiple optical waveguides, each of which couples a fraction of the radiated light beam generated by one of the VCSELs to an adjacent additional laser structure.

Although this disclosure describes illustrative embodiments of the invention in detail, it is to be understood that the invention is not limited to the precise embodiments described, and that various modifications may be practiced within the scope of the invention defined by the appended claims.

We claim:

1. An integrated laser-based light source generating an output light beam having a controlled intensity, the light source comprising:

a package including a header;

light sensor means for generating an electrical signal representing an intensity of light energy falling thereon, the light sensor means including a light-receiving face and being mounted on the header;

a laser having one and only one light-emitting face from which a light beam is radiated as a radiated light beam, the laser being mounted in the package adjacent the light sensor means with the light-emitting face substantially parallel to the light-receiving face; and convex beam-splitting surface means for reflecting a fraction of the radiated light beam towards the light sensor means as a reflected light beam, and for transmitting a remainder of the radiated light beam as the output light beam, the convex beam-splitting surface means being supported in the radiated light beam by the package.

2. The light source of claim 1, wherein the convex beam-splitting surface means includes reflection control means for determining an intensity ratio between the reflected light beam and the output light beam.

3. The light source of claim 1, wherein the laser and the light sensor means are mounted side-by-side on the header.

4. The light source of claim 1, wherein the laser is mounted on part of the light-receiving face of the light sensor means.

5. The light source of claim 1, wherein:

the package includes a can attached to the header; and the convex beam-splitting surface means is supported in the radiated light beam by the can.

6. The light source of claim 5, wherein the light source additionally includes a lens, the lens including the convex beam-splitting surface means.

7. The light source of claim 1, wherein:

the light source additionally includes a lens, the lens including the convex beam-splitting surface means; and the package includes:

an axial bore in which the lens is mounted, and
a body portion optically aligned with the axial bore and dimensioned to accommodate the header in an adjustable position relative to the lens.

8. The light source of claim 7, wherein the axial bore includes a portion dimensioned to receive an optical fibre and to position the optical fibre accurately in a predetermined position relative to the lens.

9. The light source of claim 7, wherein the laser is mounted on part of the light-receiving face of the light sensor means.

10. The light source of claim 7, wherein the beam-splitting surface means includes reflection control means for determining an intensity ratio between the reflected light beam and the output light beam.

11. The light source of claim 10, wherein the laser and the light sensor means are mounted side-by-side on the header.

12. The light source of claim 10, wherein the laser is mounted on part of the light-receiving face of the light sensor means.

13. The light source of claim 1, wherein the laser, the light sensor means and the convex beam-splitting surface means are arranged such that light reflected by the light-receiving face of the light sensor means is directed away from the light emitting face of the laser to reduce noise in the output light beam.

14. The light source of claim 1, wherein:
the laser generates the radiated light beam in response to a laser current; and
the light source additionally includes control means, operating in response to the electrical signal generated by the light sensor means, for controlling the laser current.

15. The light source of claim 14, wherein the control means is additionally for controlling the laser current to limit the electrical signal generated by the light sensor means to a predetermined maximum corresponding to a predetermined maximum intensity of the output light beam.

16. The light source of claim 1, wherein the beam-splitting surface means includes reflection control means for determining an intensity ratio between the output light beam and the fraction of the radiated light beam reflected towards to the light sensor means as the reflected light beam.

17. The light source of claim 1, wherein:
the radiated light beam generated by the laser has an intensity and a signal-to-noise ratio, the signal-to-noise ratio being dependent on the intensity;
the intensity at which the laser generates the radiated light beam with a signal-to-noise ratio above a threshold level is greater than a predetermined maximum intensity; and
the beam-splitting surface means is for reflecting such a fraction of the radiated light beam to the light sensor means that the output light beam has a signal-to-noise ratio greater than the threshold level and an intensity less than the predetermined maximum intensity.

18. An integrated laser-based light source for illuminating an optical fibre with an output light beam having a controlled intensity, the light source comprising:
a laser/sensor assembly, including:
a header,
light sensor means for generating an electrical signal representing an intensity of light energy falling thereon, the light sensor means including a light-receiving face and being mounted on the header,
a laser having one and only one light-emitting face from which a light beam is radiated as a radiated light beam, the laser being mounted adjacent the light sensor means with the light-emitting face substantially parallel to the light-receiving face;
a ball lens; and
a package, including:
an axial bore in which the ball lens is mounted, the bore including a portion dimensioned to receive the optical fibre and to position the optical fibre accurately relative to the ball lens, and
a body portion optically aligned with the axial bore and dimensioned to adjustably accommodate the laser/sensor assembly in a position relative to the ball lens at which the ball lens reflects a fraction of the radiated light beam towards the light sensor means as a reflected light beam, the ball lens transmits a remainder of the radiated light beam as the output light beam, and the intensity of the output light beam is maximized.

19. The light source of claim 18, wherein the laser and the light sensor means are mounted side-by-side on the header.

20. The light source of claim 18, wherein the laser is mounted on part of the light-receiving face of the light sensor means.

21. A method of making an integrated laser-based light source for illuminating an optical fibre with an output light beam having a controlled intensity, the method comprising steps of:
providing:
a laser/sensor assembly, the laser/sensor assembly including:
a header;
light sensor means for generating an electrical signal representing an intensity of light energy falling thereon, the light sensor means including a light-receiving face and being mounted on the header;
a laser having one and only one light-emitting face from which a light beam is radiated as a radiated light beam, the laser being mounted in the package adjacent the light sensor means with the light-emitting face substantially parallel to the light-receiving face,
a lens, the lens having a convex surface, and
a package, the package including:
an axial bore including portions dimensioned to receive the lens and the optical fibre such that the optical fibre is positioned accurately in a predetermined position relative to the lens; and
a body portion optically aligned with the axial bore and dimensioned to receive the laser/sensor assembly with a clearance fit;
mounting the lens in the axial bore of the package;
inserting the laser/sensor assembly into the body portion to a position at which the convex surface of the lens reflects a fraction of the radiated light beam towards the light sensor means as a reflected light beam, and the lens transmits a remainder of the radiated light beam as the output light beam;
adjusting the position of the laser/sensor assembly relative to the lens to maximize the intensity of the output light beam; and
fixing the laser/sensor assembly in the body portion at the position attained in the adjusting step.

22. The method of claim 21, wherein:
the method additionally comprises a step of applying a curable adhesive to at least one of the body portion and the laser/sensor assembly; and
the fixing step includes a step of curing the adhesive.

* * * * *